(12) United States Patent
Shakoor et al.

(10) Patent No.: US 11,569,414 B2
(45) Date of Patent: Jan. 31, 2023

(54) SELF-ALIGNED ITO DBR BASED P-CONTACT FOR SMALL PITCH MICRO-LED

(71) Applicant: Meta Platforms Technologies, LLC, Menlo Park, CA (US)

(72) Inventors: Abdul Shakoor, Plymouth (GB); Mohsin Aziz, Plymouth (GB); Jun-Youn Kim, Plymouth (GB)

(73) Assignee: Meta Platforms Technologies, LLC, Menlo Park, CA (US)

( * ) Notice: Subject to any disclaimer, the term of this patent is extended or adjusted under 35 U.S.C. 154(b) by 166 days.

(21) Appl. No.: 17/177,980

(22) Filed: Feb. 17, 2021

(65) Prior Publication Data
US 2022/0262981 A1 Aug. 18, 2022

(51) Int. Cl.
*H01L 33/10* (2010.01)
*H01L 33/46* (2010.01)
(Continued)

(52) U.S. Cl.
CPC ............ *H01L 33/10* (2013.01); *H01L 27/153* (2013.01); *H01L 33/005* (2013.01);
(Continued)

(58) Field of Classification Search
CPC ..... H01L 27/153; H01L 33/005; H01L 33/10; H01L 33/382; H01L 33/42; H01L 33/46;
(Continued)

(56) References Cited

U.S. PATENT DOCUMENTS 7,906,787 B2 3/2011 Kang
10,446,724 B2 10/2019 Kwon et al.
(Continued)

FOREIGN PATENT DOCUMENTS

CN 102903799 A 1/2013
CN 106025010 A 10/2016

OTHER PUBLICATIONS

Chen P.W., et al., "Improved Performance of Passive-Matrix Micro-LED Displays using a Multi-Function Passivation Structure," IEEE Photonics Journal, Aug. 2020, vol. 12, No. 4, 12 pages.
(Continued)

*Primary Examiner* — Savitri Mulpuri
(74) *Attorney, Agent, or Firm* — Weaver Austin Villeneuve & Sampson LLP

(57) ABSTRACT

A micro-light emitting diode includes a substrate including at least a first portion of an n-type semiconductor layer, and a mesa structure on the substrate and characterized by a linear lateral dimension equal to or less than about 3 μm. The mesa structure includes a plurality of epitaxial layers, and a conductive distributed Bragg reflector (DBR) on the plurality of epitaxial layers. The conductive DBR includes a plurality of transparent conductive oxide layers and covers between about 80% and about 100% of a full lateral area of the plurality of epitaxial layers. The micro-LED also includes a dielectric layer on sidewalls of the mesa structure, a reflective metal layer on sidewalls of the dielectric layer and electrically coupled to the first portion of the n-type semiconductor layer, and a first metal electrode in direct contact with the conductive DBR.

6 Claims, 20 Drawing Sheets

(51) Int. Cl.
*H01L 27/15* (2006.01)
*H01L 33/00* (2010.01)
*H01L 33/38* (2010.01)
*H01L 33/42* (2010.01)
*H01L 33/60* (2010.01)

(52) U.S. Cl.
CPC ............ *H01L 33/382* (2013.01); *H01L 33/42* (2013.01); *H01L 33/46* (2013.01); *H01L 33/60* (2013.01); *H01L 2933/0025* (2013.01); *H01L 2933/0058* (2013.01)

(58) Field of Classification Search
CPC ............. H01L 33/60; H01L 2933/0025; H01L 2933/0058
See application file for complete search history.

(56) References Cited

U.S. PATENT DOCUMENTS

2014/0054625 A1  2/2014  McKenzie
2020/0403107 A1* 12/2020  Chu ...................... H01L 27/153

OTHER PUBLICATIONS

International Search Report and Written Opinion for International Application No. PCT/US2022/016608, dated May 27, 2022, 10 pages.

Lee C-C., et al., "Transparent Conductive Distributed Bragg Reflectors Composed of High and Low Refractive Index Transparent Conductive Films," Japanese Journal of Applied Physics, vol. 51, 2012, 4 pages.

Oh S.H., et al., "Fabrication of HfO2/TiO2-based Conductive Distributed Bragg Reflectors: Its Application to GaN-based Near-Ultraviolet Micro-Light Emitting Diodes," Journal of Alloys and Compounds, vol. 773, 2019, pp. 490-495.

Schubert M.F., et al., "Distributed Bragg Reflector Consisting of High- and Low-Refractive-Index Thin Film Layers made of the Same Material," Applied Physics Letters, vol. 90, 2007, 3 pages.

SemiconductorToday, "Gallium Nitride VCSEL with Electrically Conductive Bottom Mirror and Contact," Compounds and Advanced Silicon, Aug. 14, 2020, 4 pages (available at https://www.semiconductor-today.com/news_items/2020/aug/yale-070820.shtml).

Tien W.C., et al., "ITO DBR Electrodes Fabricated on PET Substrate for Organic Electronics," Optics Express, Feb. 12, 2014, vol. 22, No. 4, pp. 3944-3949.

Tien W.C., et al., "Narrow-Band Emitting Microcavity OLED with ITO DBR electrode for Sensing Applications," Electronics Letters, Nov. 19, 2015 vol. 51, No. 24 pp. 2034-2035.

Zhou S., et al., "GaN-based Flip-Chip LEDs with Highly Reflective ITO/DBR p-type and via Hole-based n-type Contacts for Enhanced Current Spreading and Light Extraction," Optics & Laser Technology, Jan. 24, 2017, vol. 92, pp. 95-100.

* cited by examiner

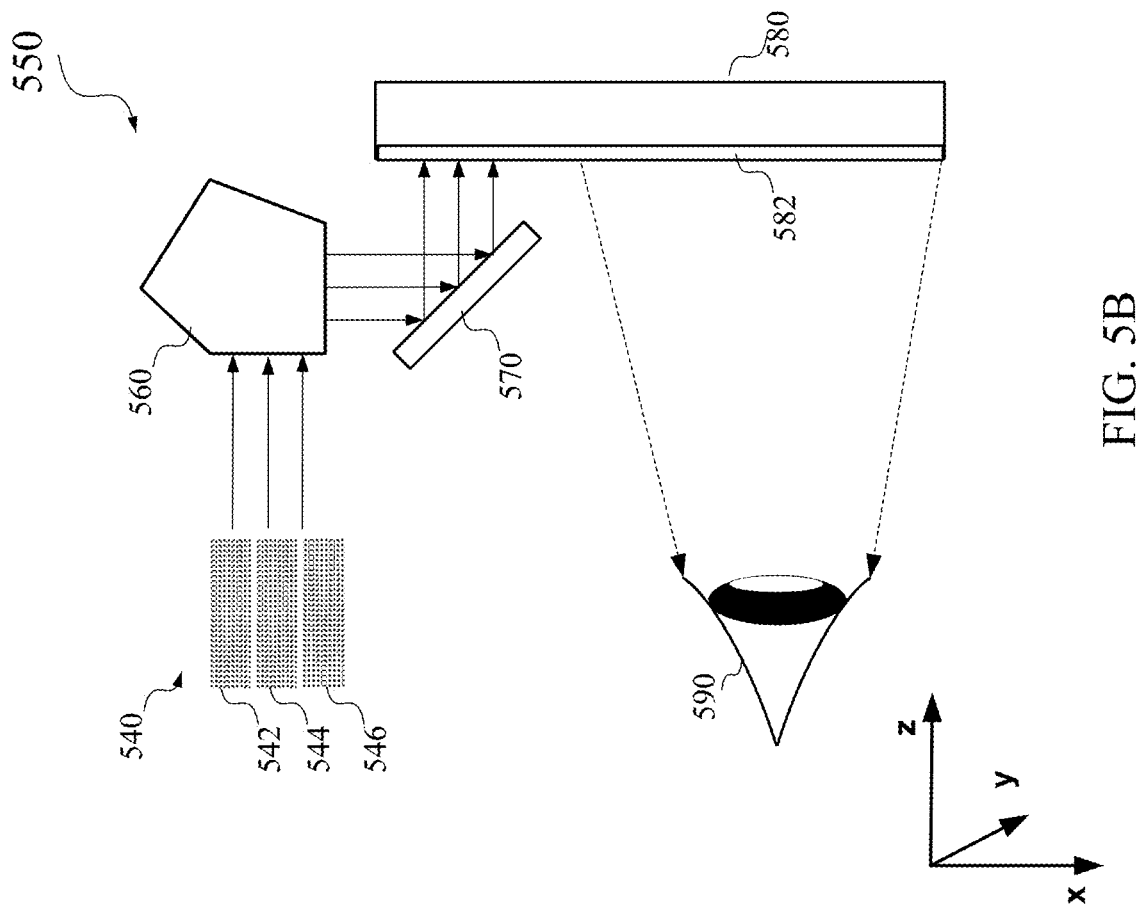
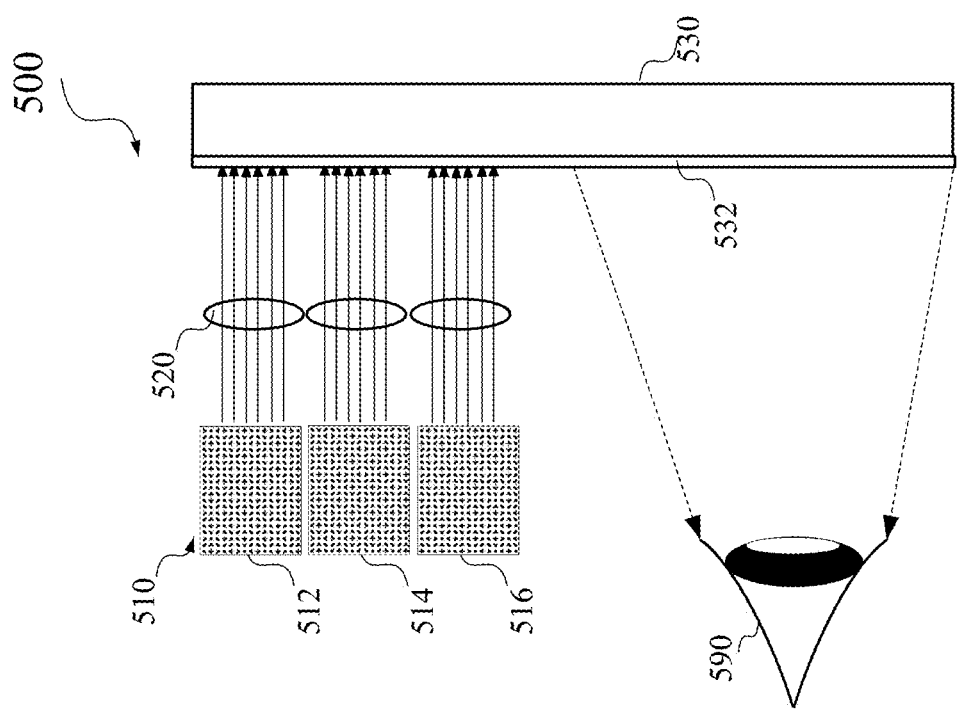

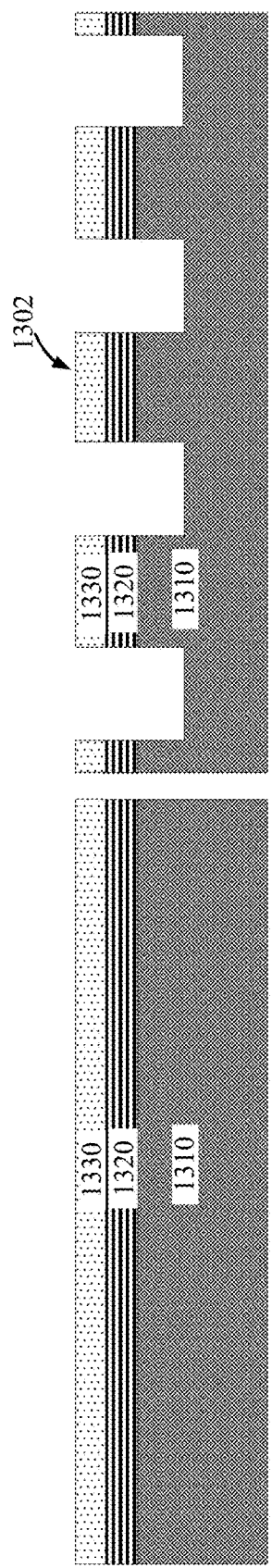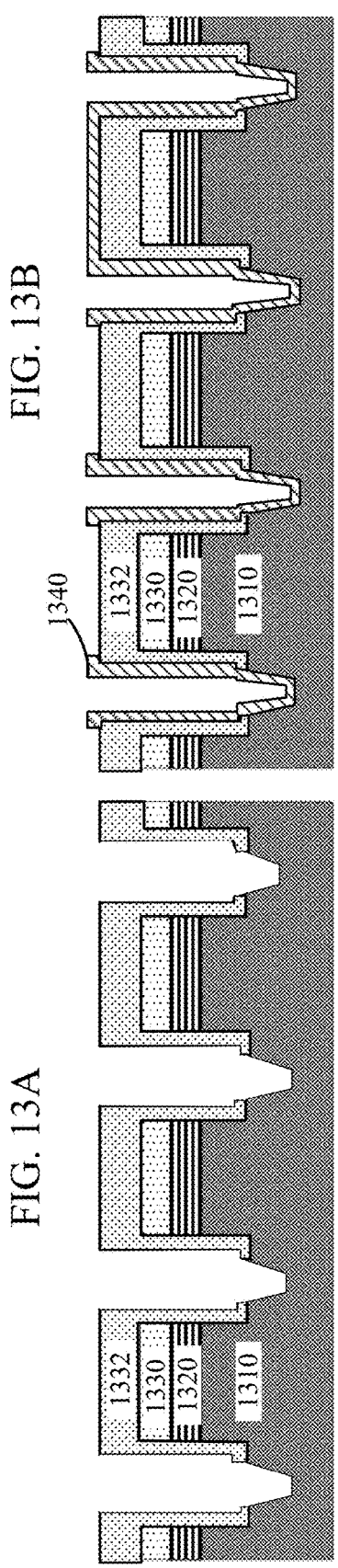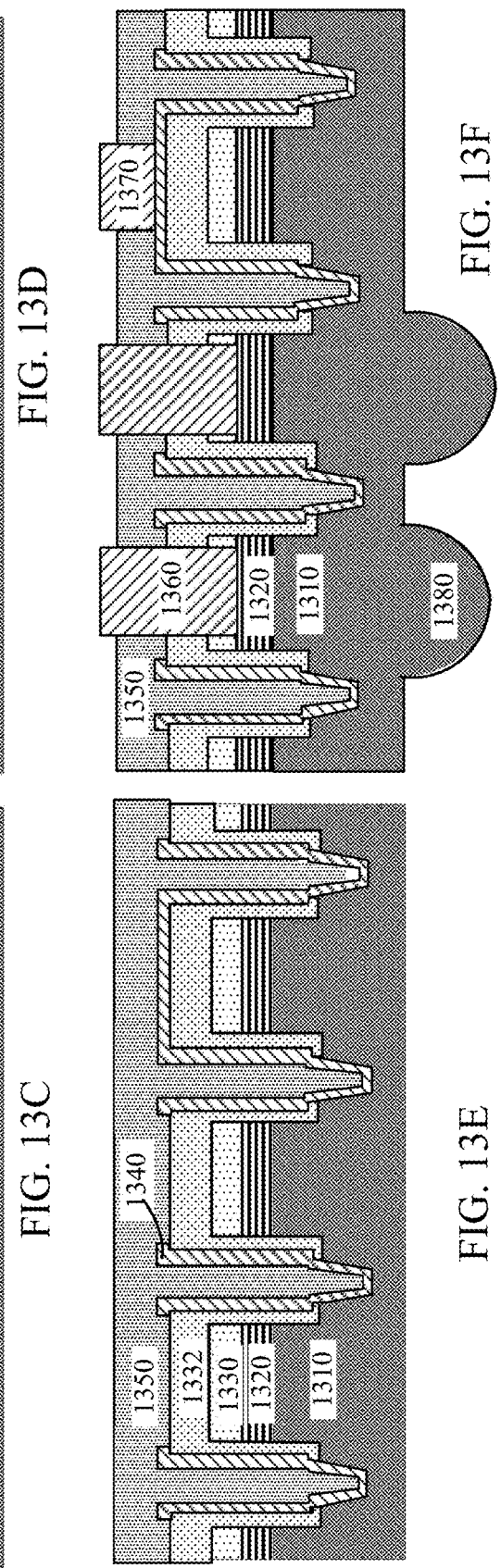

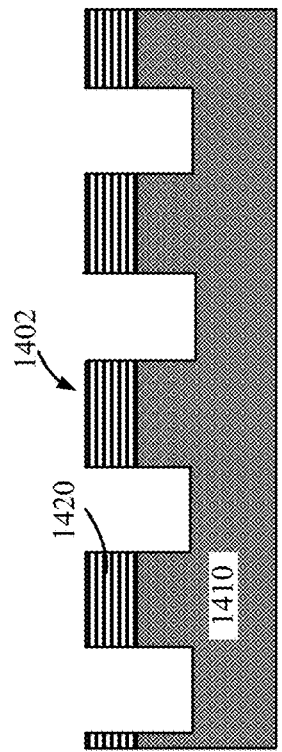
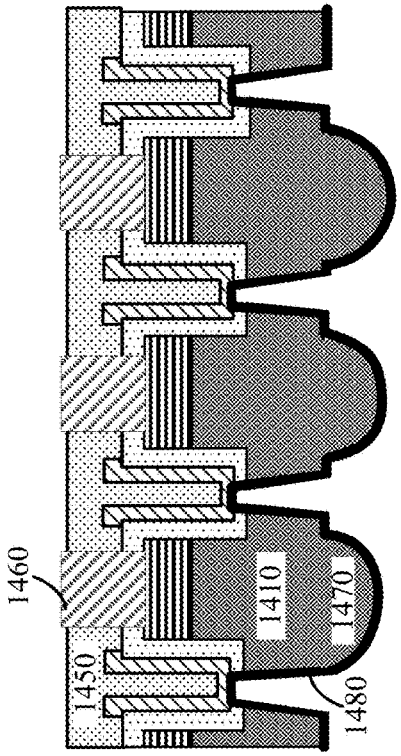
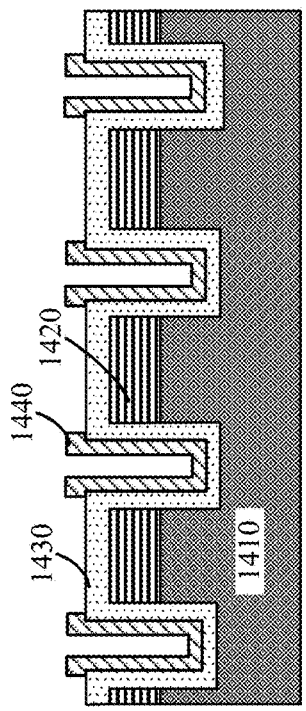
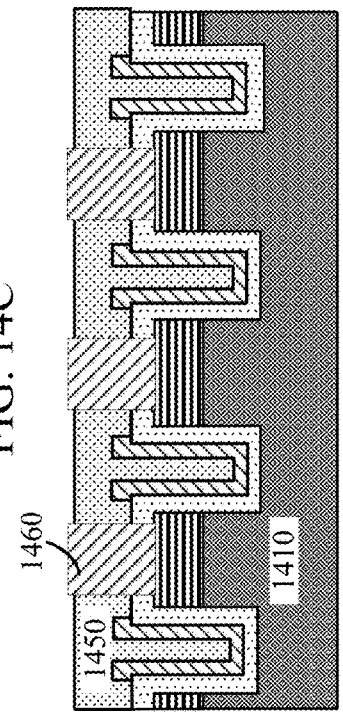
FIG. 14A
FIG. 14B
FIG. 14C
FIG. 14D
FIG. 14E
FIG. 14F

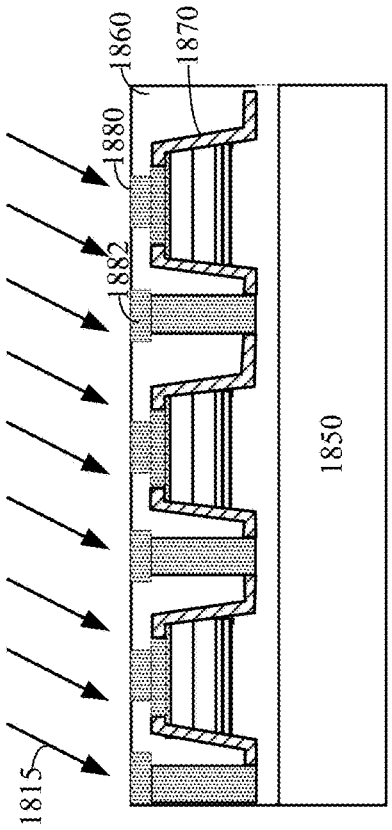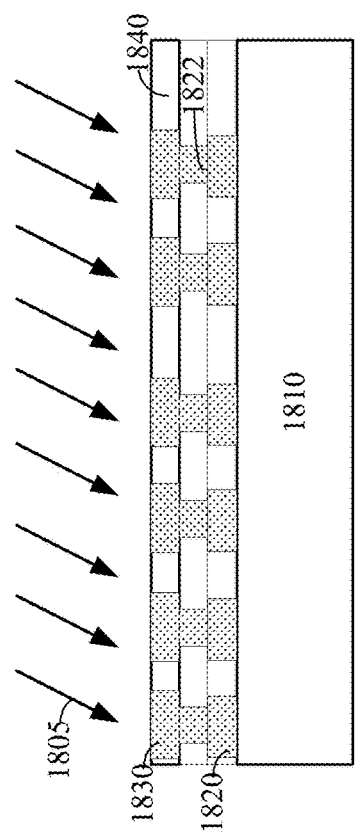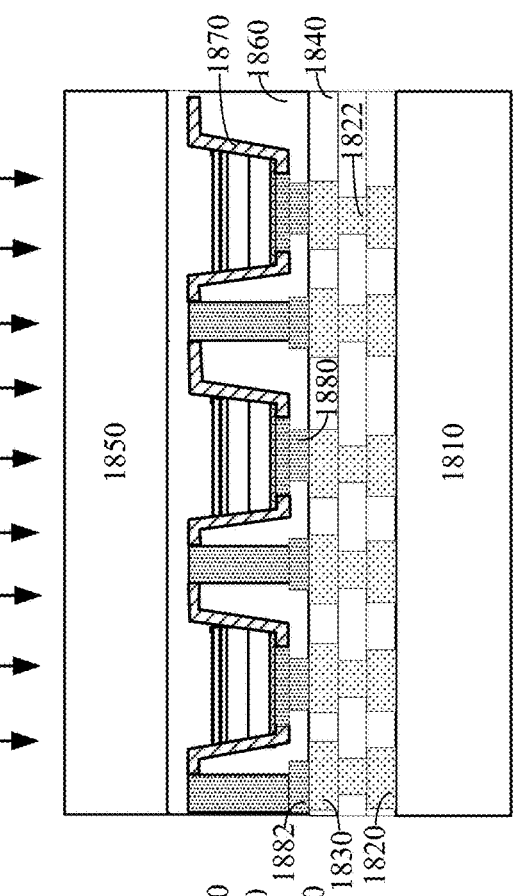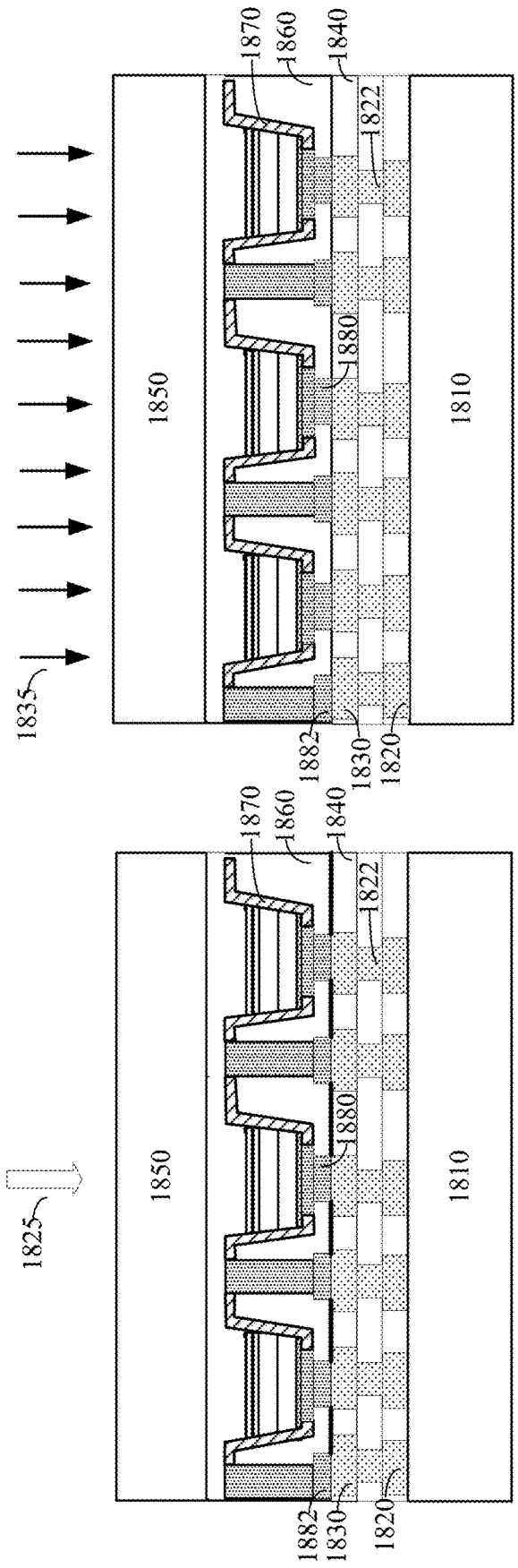

SELF-ALIGNED ITO DBR BASED P-CONTACT FOR SMALL PITCH MICRO-LED

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of GaN, InN, AlGaInP, other quaternary phosphide compositions, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro-light emitting diodes (micro-LEDs). More specifically, this disclosure relates to small micro-LEDs including conductive distributed Bragg reflectors (DBRs)-based electrical contacts and techniques for manufacturing the small micro-LEDs. According to certain embodiments, a micro-LED device may include a substrate including at least a first portion of an n-type semiconductor layer, and may include an array of micro-LEDs on the substrate and characterized by a pitch equal to or less than about 4 µm. Each micro-LED of the array of micro-LEDs may include a mesa structure that includes a plurality of epitaxial layers, and a conductive distributed Bragg reflector (DBR) on the plurality of epitaxial layers. The conductive DBR may include a plurality of transparent conductive oxide layers and may cover at least 80%, at least 90%, or at least 95% of a full lateral area of the plurality of epitaxial layers. Each micro-LED may also include a dielectric layer on sidewalls of the mesa structure, a reflective metal layer on sidewalls of the dielectric layer and electrically coupled to the first portion of the n-type semiconductor layer, and a first metal electrode in direct contact with the conductive DBR.

In some embodiments of the micro-LED device, the conductive DBR may align with the plurality of epitaxial layers and cover the full lateral area of the plurality of epitaxial layers in the mesa structure. The plurality of transparent conductive oxide layers of the conductive DBR may include a first set of indium tin oxide (ITO) layers characterized by a first refractive index, and a second set of ITO layers characterized by a second refractive index and interleaved with the first set of ITO layers. In some embodiments, the first set of ITO layers may include crystalline ITO, and the second set of ITO layers may include porous ITO. In some embodiments, the first set of ITO layers may include ITO nanorods in a first orientation, while the second set of ITO layers may include ITO nanorods in a second orientation that is different from the first orientation. In some embodiments, the first refractive index may be greater than about 2.0 (e.g., greater than about 2.1 or 2.2) for a target wavelength, and the second refractive index may be less than about 1.7 (e.g., less than about 1.6 or 1.5) for the target wavelength. The large refractive index contrast may help to achieve a high reflectance with a small number of ITO layers. In some embodiments, a reflectance of the conductive DBR for a target wavelength may be greater than about 90%, greater than about 95%, greater than about 98%, or about 100%.

In some embodiments of the micro-LED device, the plurality of epitaxial layers may include a second portion of the n-type semiconductor layer, an active region including one or more quantum wells configured to emit visible light, and a p-type semiconductor layer coupled to the conductive DBR. In some embodiments, each micro-LED of the array of micro-LEDs may include a micro-lens on the substrate. In some embodiments, the micro-LED device may include at least one of a second metal electrode electrically coupled to the reflective metal layer and the first portion of the n-type semiconductor layer, or a transparent conductive oxide layer electrically coupled to the first portion of the n-type semiconductor layer or the reflective metal layer.

According to certain embodiments, a micro-LED may include a substrate including at least a first portion of an n-type semiconductor layer; and may include a mesa structure on the substrate and characterized by a linear lateral dimension equal to or less than about 3 µm. The mesa structure may include a plurality of epitaxial layers, and a conductive distributed Bragg reflector (DBR) on the plurality of epitaxial layers. The conductive DBR may include a plurality of transparent conductive oxide layers and may cover at least about 80%, at least 90%, or about 100% of a full lateral area of the plurality of epitaxial layers. The micro-LED may also include a dielectric layer on sidewalls of the mesa structure, a reflective metal layer on sidewalls of the dielectric layer and electrically coupled to the first portion of the n-type semiconductor layer, and a first metal electrode in direct contact with the conductive DBR.

In some embodiments of the micro-LED, the conductive DBR may align with the plurality of epitaxial layers and may cover the full lateral area of the plurality of epitaxial layers in the mesa structure. The plurality of transparent conductive oxide layers may include a first set of indium tin oxide (ITO) layers characterized by a first refractive index, and a second set of ITO layers characterized by a second refractive index and interleaved with the first set of ITO layers, where the first set of ITO layers and the second set of ITO layers may have different porosities or different nanorod orientations. In some embodiments, a reflectance of the conductive DBR for a target wavelength may be greater than about 90%, greater than about 95%, greater than about 98%, or about 100%.

According to certain embodiments, a method may include forming a layer stack on a substrate, where the layer stack may include a plurality of epitaxial layers and a plurality of transparent conductive oxide layers that form a conductive distributed Bragg reflector (DBR). The method may also include etching the layer stack using a same etch mask layer to form an array of mesa structures in the layer stack, the array of mesa structures characterized by a pitch equal to or less than about 4 µm; forming a first dielectric layer on surfaces of the array of mesa structures and regions between mesa structures in the array of mesa structures; forming a patterned metal layer on surfaces of the first dielectric layer; depositing a second dielectric layer on the patterned metal layer and the first dielectric layer; and forming, in the first dielectric layer and the second dielectric layer, at least one of a first set of metal plugs contacting the conductive DBR, or a second set of metal plugs contacting the patterned metal layer.

In some embodiments, forming the layer stack on the substrate may include growing the plurality of epitaxial layers on the substrate, and depositing the plurality of transparent conductive oxide layers on the plurality of epitaxial layers. The plurality of epitaxial layers may include an n-type semiconductor layer, an active region configured to emit visible light having a first wavelength, and a p-type semiconductor layer. The plurality of transparent conductive oxide layers may include a first set of transparent conductive oxide layers characterized by a first refractive index, and a second set of transparent conductive oxide layers characterized by a second refractive index and interleaved with the first set of transparent conductive oxide layers, where a reflectance of the conductive DBR for the first wavelength may be between about 90% and about 100%. In some embodiments, the first set of transparent conductive oxide layers may include a first set of indium tin oxide (ITO) layers, the second set of transparent conductive oxide layers may include a second set of ITO layers, and the first set of ITO layers and the second set of ITO layers have different porosities or different nanorod orientations.

In some embodiments, the method may include etching, at the regions between the mesa structures, the first dielectric layer and at least a portion of the n-type semiconductor layer, where forming the patterned metal layer on the surfaces of the first dielectric layer may include forming the patterned metal layer on exposed surfaces of the n-type semiconductor layer. In some embodiments, the method may include forming a transparent conductive layer on the plurality of epitaxial layers, where the transparent conductive layer may be electrically coupled to at least one of the second set of metal plugs, the patterned metal layer, or the n-type semiconductor layer. In some embodiments, the method may include forming an array of light extraction structures on the plurality of epitaxial layers, where each of the array of light extraction structures may correspond to a respective mesa structure of the array of mesa structures.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIGS. 13A-13F illustrate an example of a self-aligned process for fabricating a micro-LED device including a conductive DBR structure acting as both the electrical contact and a back reflector according to certain embodiments.

FIGS. 14A-14F illustrate an example of a self-aligned process for fabricating a micro-LED device including a conductive DBR structure acting as both the electrical contact and a back reflector according to certain embodiments.

FIGS. 18A-18D illustrates an example of a method of hybrid bonding for arrays of LEDs according to certain embodiments.

Figure 1:
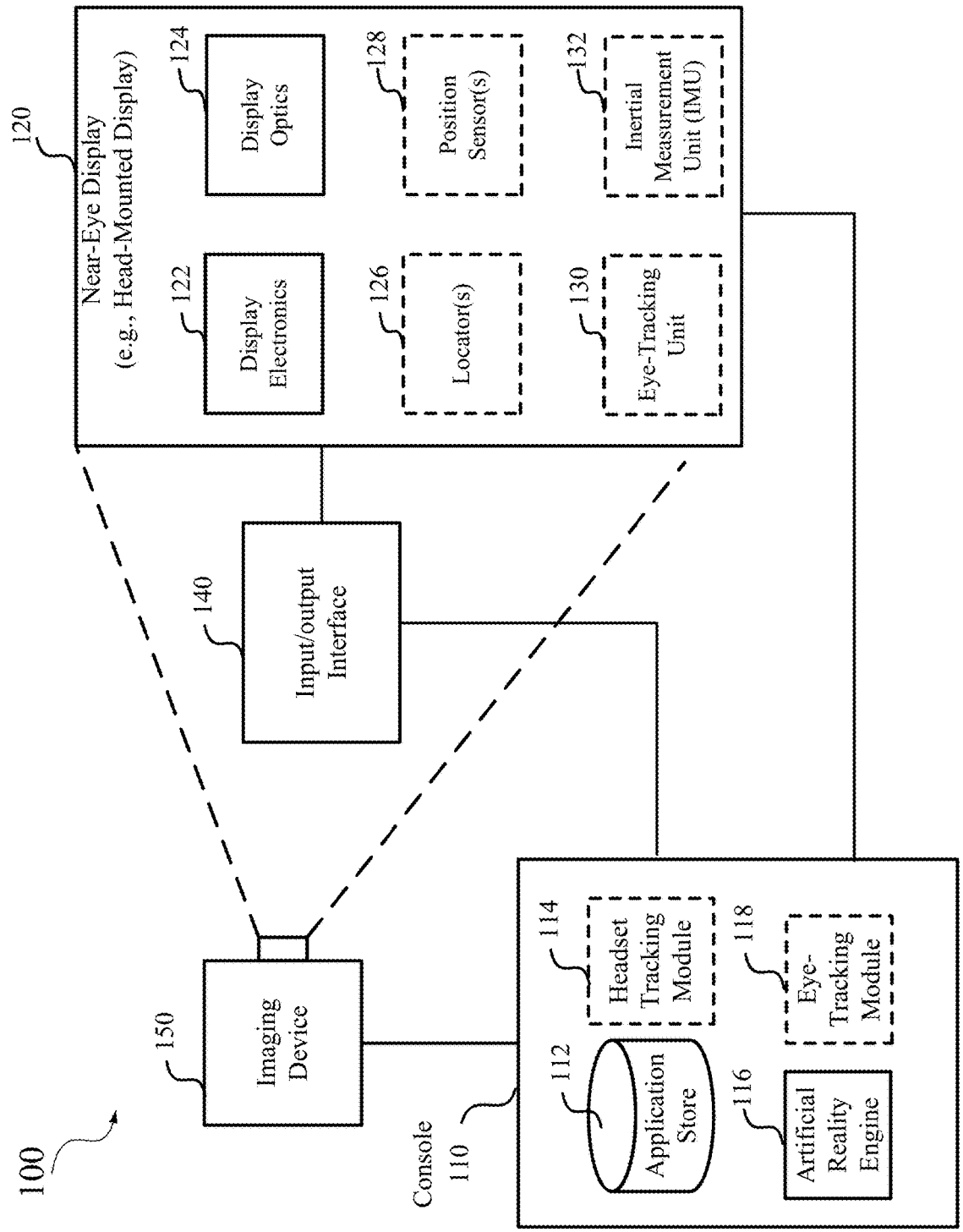
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, techniques disclosed herein relate to small micro-LEDs including conductive distributed Bragg reflectors (DBRs)-based electrical contacts and methods for manufacturing the small micro-LEDs. Various inventive embodiments are described herein, including devices, systems, engineered wafers, bonded wafer/die stacks, packages, methods, processes, materials, and the like.

In some LED structures, a reflective metal (e.g., aluminum or silver) layer may be used as both an electrical contact (e.g., p-contact or n-contact) and a back reflector for redirecting generated photons towards a light emitting surface of the LED. The reflective metal material may diffuse into semiconductor material layers at a high diffusion rate, and thus may cause a large leakage current. To reduce the diffusion and the leakage current, a conductive barrier layer having a low diffusion rate (e.g., a titanium and/or tungsten layer) may be formed around the reflective metal layer. A dielectric layer may be formed on the barrier layer to provide additional isolation. For an LED array with a small pitch, such as less than about 4 μm or less than about 3 μm, the linear lateral dimension of each LED may be less than about 3 μm, less than about 2 μm, or less than about 1.5 μm. As such, the lateral dimensions of the reflective metal layer and the barrier layer may be very small, thus leaving very little margin for alignment error during the subsequent fabrication processes. For example, opening apertures in the dielectric layer on the barrier layer to form metal plugs for making electrical contacts with the reflective metal layer via the barrier layer may reach the lithographic limit and may need very precise alignment, since the lateral size of the apertures may need to be even smaller than the lateral size of the barrier layer. In addition, when the pitch of the LED array is reduced, the lateral size of the reflective metal layer may need to be reduced more in order to leave sufficient room for the barrier layer and the dielectric layer at the sidewalls of the reflective metal layer to maintain a low leakage. Reducing the size of the reflective metal layer may reduce the overall reflectivity of the back reflector, and thus may reduce the efficiency of the LEDs.

Distribute Bragg reflectors (DBRs) may be used in some light emitting devices, such as some LEDs (e.g., resonant cavity LEDs) and vertical-cavity surface-emitting lasers (VCSELs), to reflect light and/or form a resonant cavity. DBRs made of dielectric materials, such as $TiO_2$ and $SiO_2$, are generally not electrically conductive. Conductive DBRs may be formed using epitaxially grown semiconductor layers with alternating doping densities, which generally have low refractive index contrast. In addition, some of these semiconductor materials may not be transparent to the emitted light due to high absorption. For large pitch light emitting devices, a DBR made of dielectric layers can be used in conjunction with metal plugs that pass through the dielectric layers to form reflective electrical contacts. For small pitch light emitting devices, the size of the metal plugs may reach the lithographic limit. In addition, it can be difficult to etch the high aspect ratio apertures through the dielectric layers and to fill the large aspect ratio apertures with metal plugs. Furthermore, a transparent current spreading layer, such as an ITO layer, may need to be formed under the dielectric DBRs to improve the electrical connectivity.

According to certain embodiments, a conductive DBR made of transparent conductive material may be used as the electrical contact (e.g., the p-contact), the back reflector, and the current spreading layer. In some examples, the conductive DBR includes layers of a same transparent conductive oxide (e.g., ITO, IZO (Indium Zinc Oxide), or AZO (Aluminum Zinc Oxide)), where the layers may have alternating refractive indices caused by different porosities and/or nanorod orientations of the transparent conductive oxide. For example, the conductive DBR may include a set of crystalline ITO layers (e.g., having a first refractive index that can be tuned to desire value, such as about 2.2 or another desired value) interleaved with a set of porous ITO layers (e.g., having a second refractive index that can be tuned to desire value, such as about 1.5 or another desired value). In some embodiments, the conductive DBR may include layers of different transparent conductive oxides that have different refractive indices. Due to the high refractive index contrast between adjacent layers, the conductive DBR can achieve a very high reflectance (e.g., >90% or >95%, such as close to 99% or 100%) using a relatively small number of layers, and thus may have a low overall thickness and a low resistance.

Furthermore, because no metal p-contact reflector (e.g., a silver layer) is used, the barrier layer for the diffusive reflective metal would not be needed. As such, the conductive DBR can have about the same lateral size as the epitaxial layers in the mesa structure to reduce the contact resistance and increase the overall reflectance of the back reflector at the electrical contact (e.g., the p-contact), such that almost all emitted light passing through the p-type semiconductor layer may be reflected back towards the n-type semiconductor layer and the light emitting surface of the LED.

In addition, because the conductive DBR has about the same lateral size as the epitaxial layers in the mesa structure, the conductive DBR layer and the epitaxial layers can be etched in a same etching process or different etching steps using a same etch mask to form the individual mesa structures. Therefore, no alignment may be needed to form the conductive DBR on the epitaxial layers in each mesa structure.

As such, for the LED structures disclosed herein, the pitch and the mesa size may not be restricted by the thickness of the barrier layer and/or the lithographic limit associated with the fabrication of the metal layer, the barrier layer, the dielectric layer, and/or the metal plugs described above. In addition, the risk of misalignments during the fabrication of the mesa structures, the reflectors, and the electrical contacts may be eliminated. Therefore, the pitch and the mesa size of the LEDs may be reduced to small values and the LEDs may still be reliably fabricated. Furthermore, since the conductive DBR acts as the electrical contact (e.g., the p-contact), the current spreading layer, and the back reflector that can cover the whole active region of the mesa structure to reflect all light passing through the p-type semiconductor layer, a high total reflectance and low resistance may still be achieved even if the pitch and the mesa size of the micro-LEDs are reduced to small values, such as a few microns or about one micron. Thus, the micro-LED structures disclosed herein are highly scalable, and may be well suited for small-pitch micro LEDs, such as micro-LEDs with pitches less than about 4 µm or less than about 3 µm.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "LED array precursor" refers to an LED die or wafer that does not have the opposing electrical contacts and/or the associated driver circuitry for each LED such that a driving voltage or current may be applied to the LED for the LED to emit light. For example, an LED array precursor may be a wafer or die with an epitaxial layer stack that may or may not include the light emitting regions, a wafer or die with mesa structures formed in the epitaxial layer stack, a wafer or die with LED arrays and metal contacts formed thereon but without the driver circuitry, and the like. Accordingly, the LED die or wafer is a precursor to a monolithic LED array that may be formed after subsequent processing steps are performed, such as forming mesa structures, forming metal electrodes, bonding to electrical backplane, removing the substrate, forming light-extraction structures, or the like.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
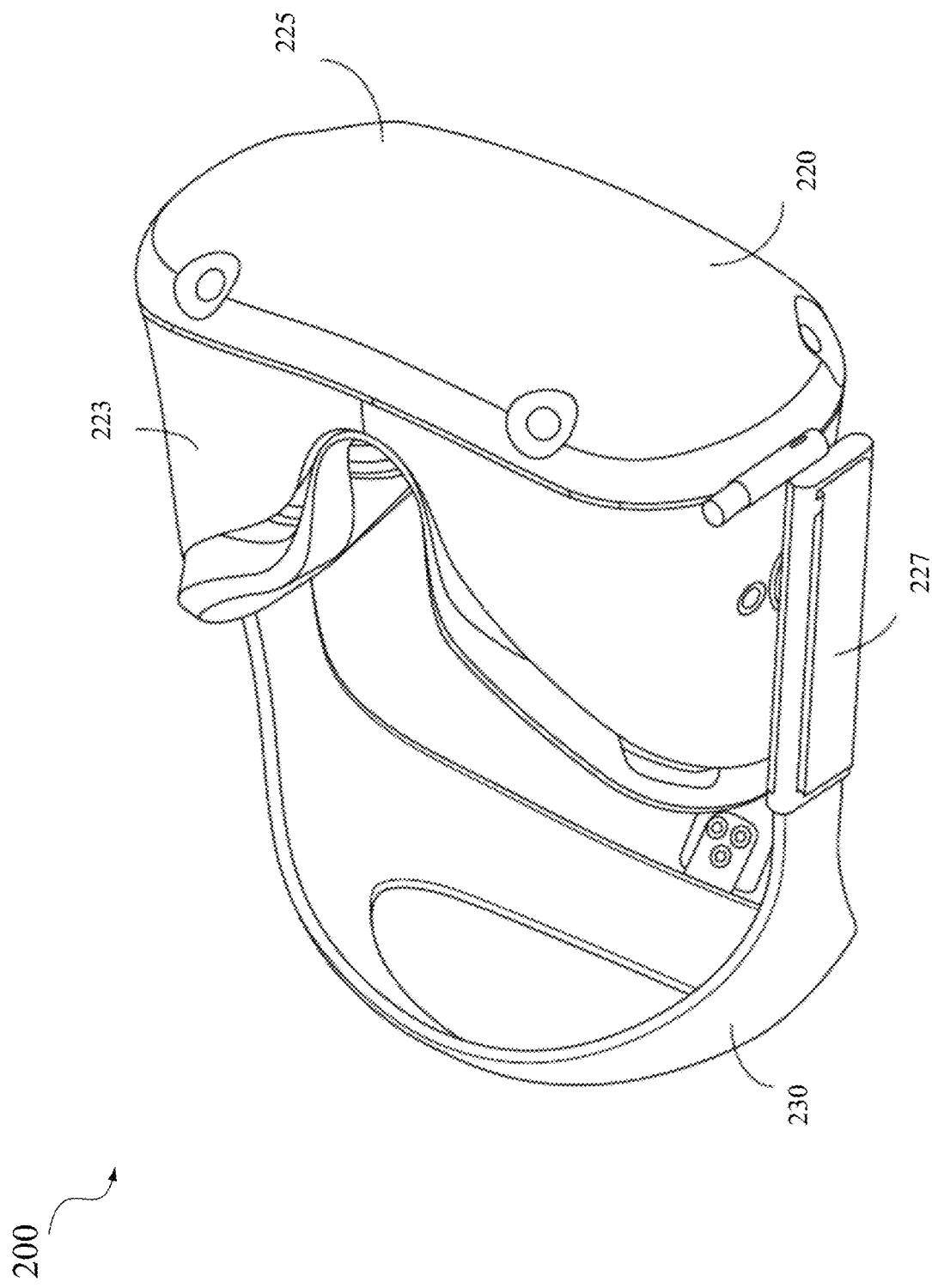
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof.

The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
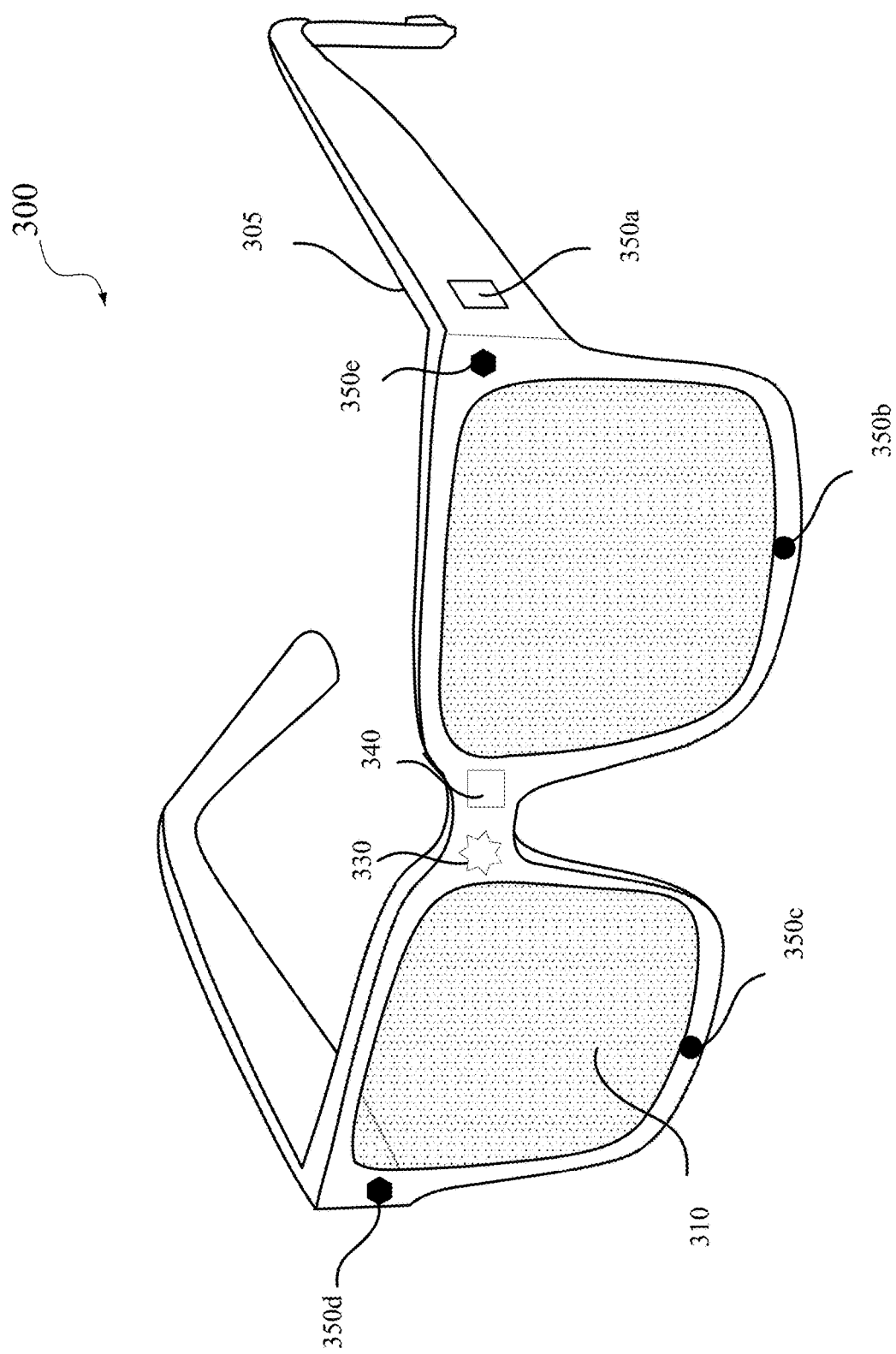
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
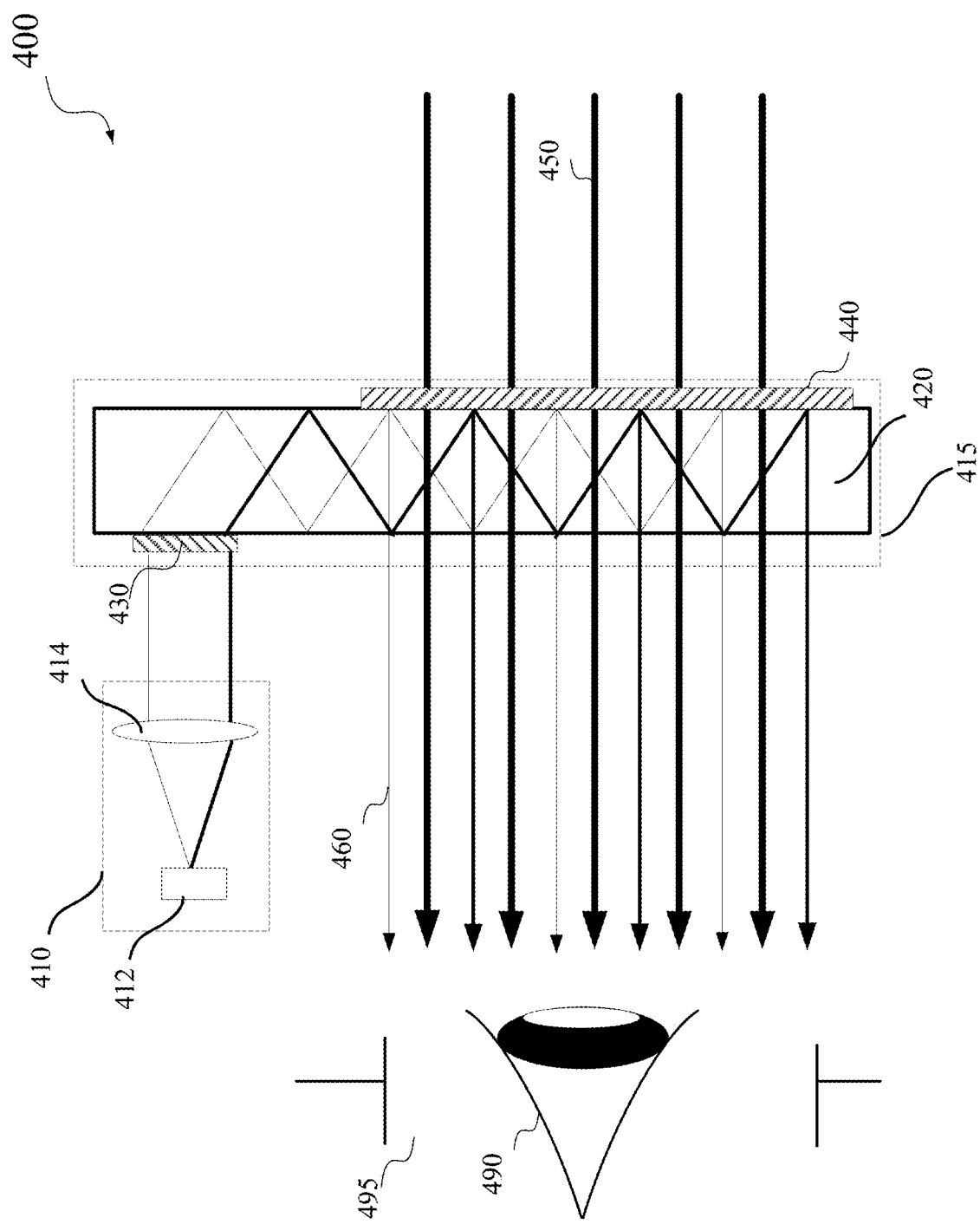
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
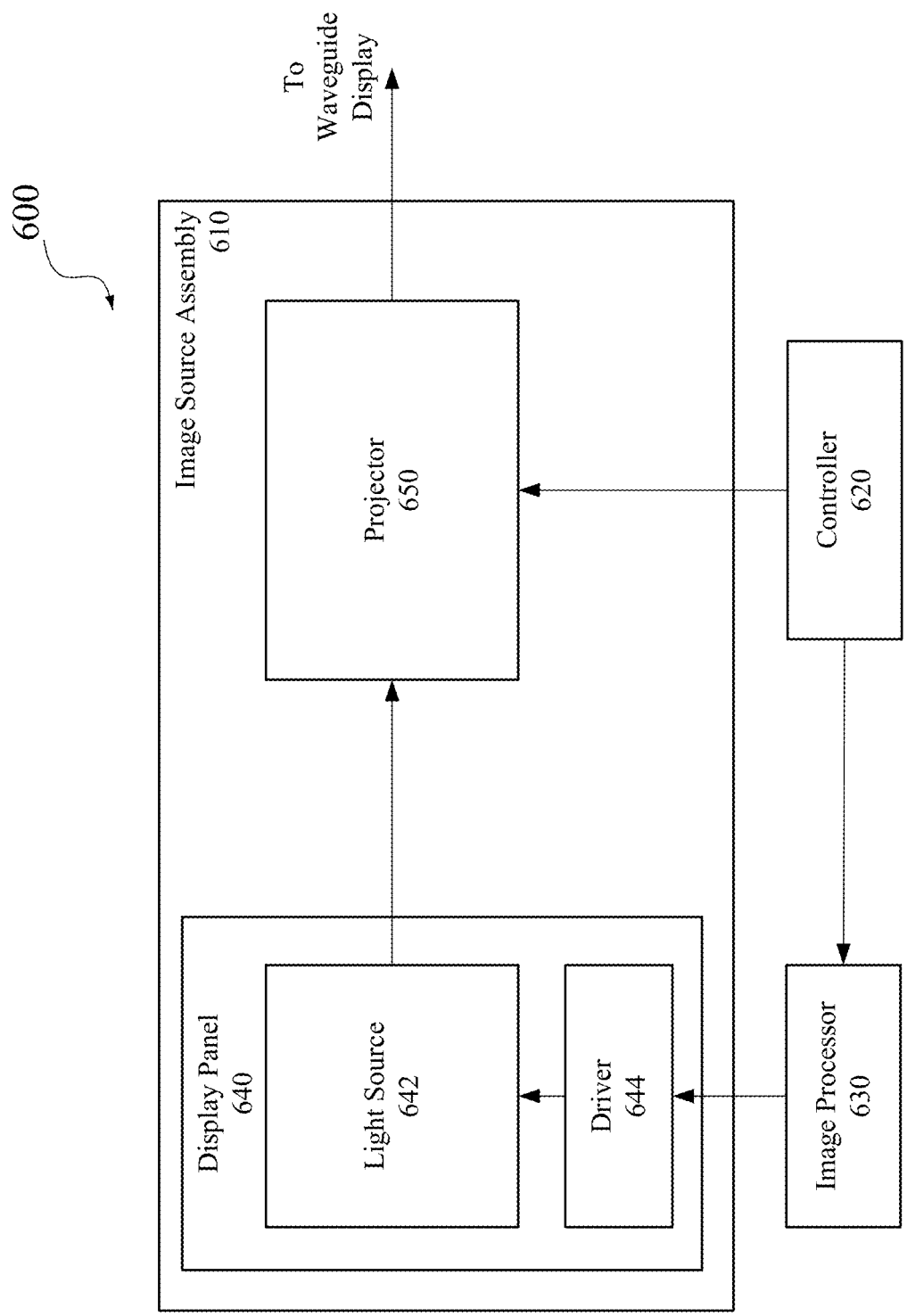
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

As described above, an array of light emitters, such as a micro-LED array, may be used as a light source to generate display images, where the micro-LEDs in the micro-LED array may be individually controlled to generate pixels of the display images. To form individual micro-LEDs in the micro-LED array, am array of mesa structures may be etched in at least some of the epitaxial layers of semiconductor materials. Each mesa structure may be further processed to add, for example, a p-contact, an n-contact, a passivation layer, and/or some light extraction structures (e.g., back and sidewall reflectors and a micro-lens), thereby forming a micro-LED.

Figure 7A:
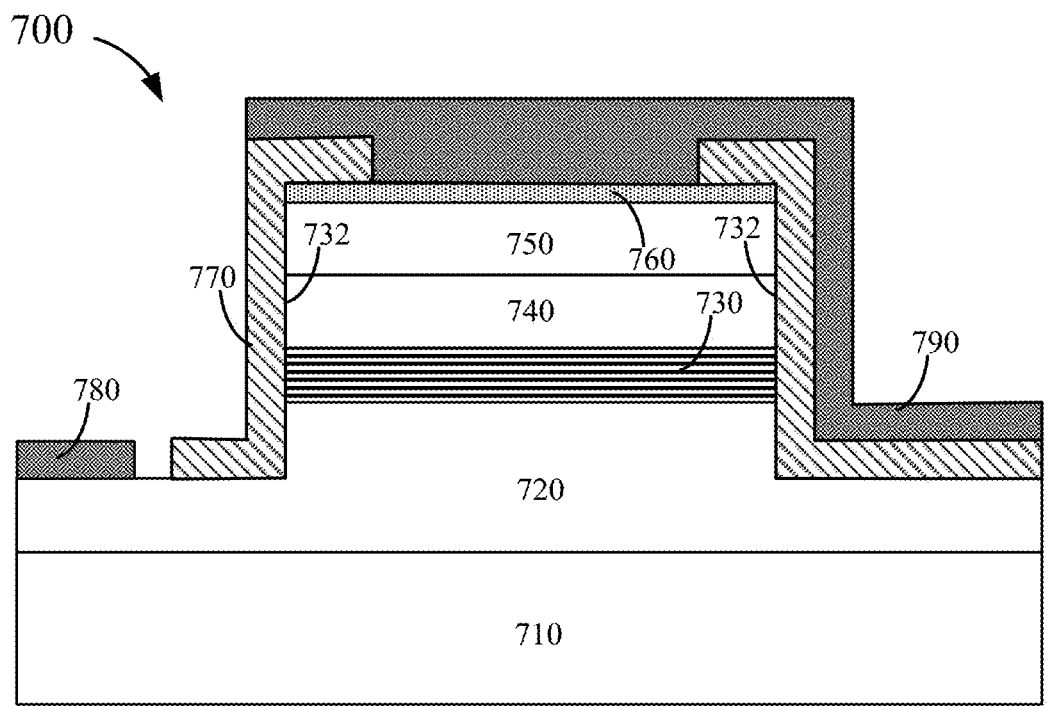
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
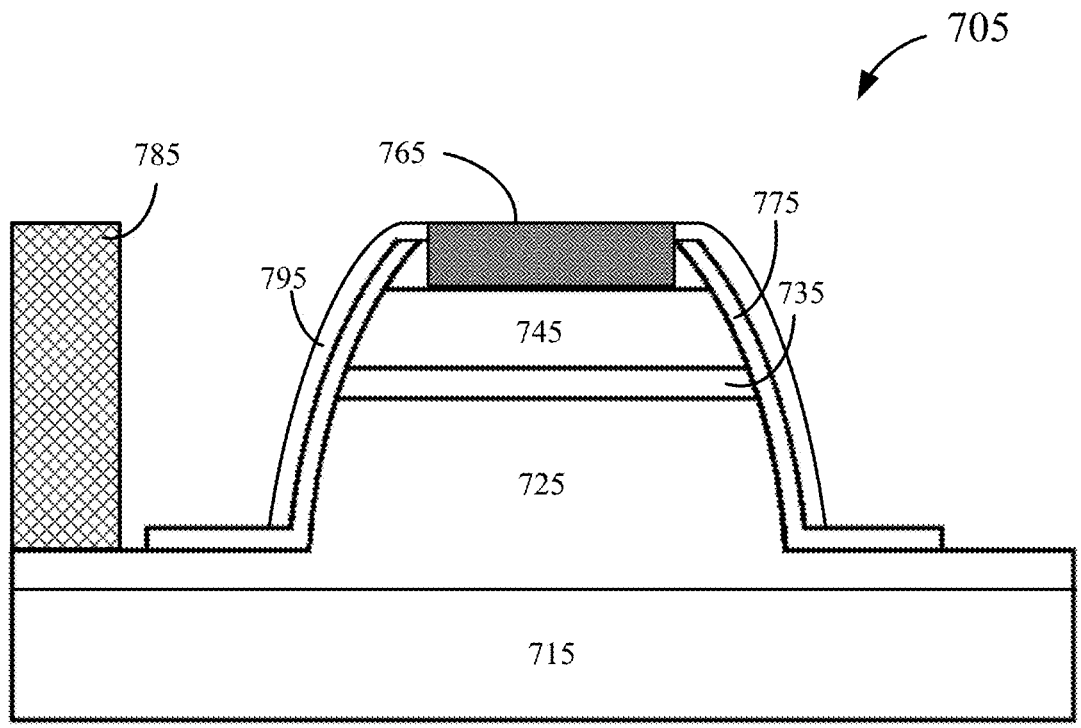
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

Figure 8B:
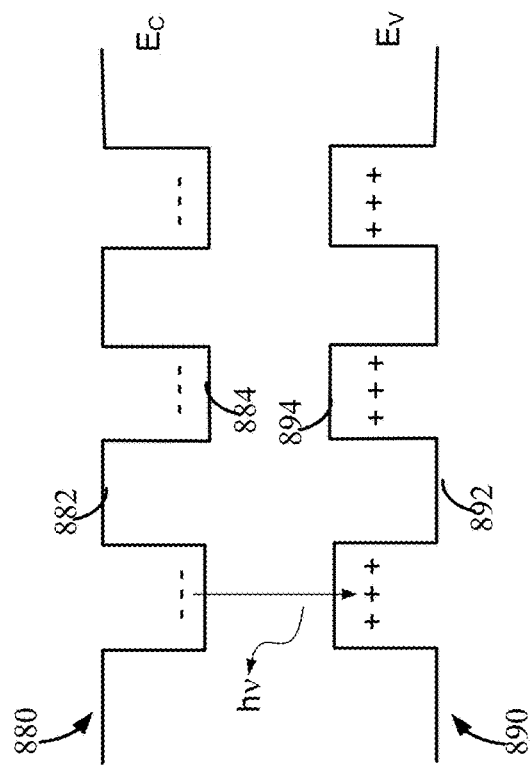
FIG. 8B illustrates a simplified energy band structure of the active region of the example of micro-LED shown in FIG. 8A.
Figure 8A:
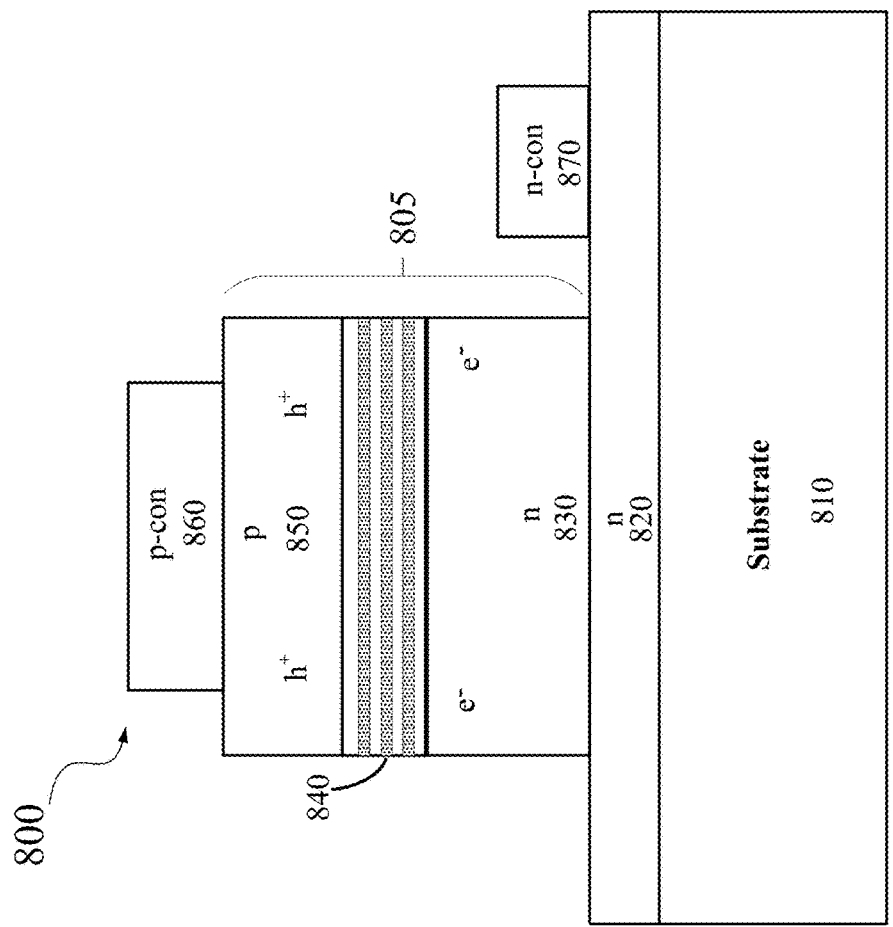
FIG. 8A illustrates an example of a micro-LED with a mesa structure.

FIG. 8A illustrates an example of a micro-LED 800 with a mesa structure 805. Micro-LED 800 may be an example of LED 700 or 705. Micro-LED 800 may include an n-type semiconductor layer 820 epitaxially grown on a substrate 810 that may be similar to substrate 710 or 715. In one example, substrate 810 may include a GaN substrate or a sapphire substrate with a buffer layer, and n-type semiconductor layer 820 may include a GaN layer doped with, for example, Si or Ge. In another example, substrate 810 may include a GaAs substrate. In the illustrated example, n-type semiconductor layer 820 may be partially etched during a mesa formation process after the epitaxially layers are grown, where mesa structure 805 may include at least a portion 830 of n-type semiconductor layer 820. One or more epitaxial layers, such as GaN barrier layers and InGaN quantum well layers, or AlGaInP barrier layers and GaInP quantum well layers, may be grown on n-type semiconductor layer 820 to form active layers 840 that includes one or more quantum wells. A p-type semiconductor layer 850 may be grown on active layers 840. P-type semiconductor layer 850 may be doped with, for example, Mg, Ca, Zn, or Be. The layer stack may then be etched to form individual mesa structures 805 that each include a p-type semiconductor region, an active region that includes active layers 840, and an n-type semiconductor region. Mesa structure 805 may have a lateral linear dimension less than about 100 µm, less than about 50 µm, less than about 20 µm, less than about 10 µm, less than about 5 µm, less than about 3 µm, less than about 2 µm, or smaller. P-contacts 860 and n-contacts 870 may be formed on the p regions and the exposed n regions of n-type semiconductor layer 820. Each p-contact 860 may include, for example, a metal layer (e.g., Al, Au, Ni, Ti, or any combination thereof), or an indium tin oxide (ITO) and/or Al/Ni/Au film. In some embodiments, p-contact 860 may form a metal reflector to reflect emitted light towards n-type semiconductor layer 820. Each n-contact 870 may also include a layer of a metal material, such as Al, Au, Ni, Ti, or any combination thereof.

Even though not shown in FIG. 8A, a passivation layer, such as an oxide layer (e.g., a $SiO_2$ layer) or another dielectric layer, may be formed on sidewalls of mesa structure 805. The passivation layer may have a lower refractive index than the active region and may function as a reflector (e.g., due to total internal reflection) to reflect certain emitted light out of micro-LED 800 as described above. As described above, in some embodiments, a metal layer may be formed on the passivation layer to form a sidewall metal reflector. Even though FIG. 8A shows a vertical mesa structure, micro-LED 800 may have a different mesa shape, such as a conical, parabolic, inward-tilted, or outward-tilted mesa shape.

When a voltage or current signal is applied to p-contact 860 and n-contact 870, holes and electrons may be injected into active layers 840 from p-type semiconductor layer 850 and portion 830 of n-type semiconductor layer 820, respectively. The electrons and holes may recombine in the quantum wells of active layers 840, where the recombination of electrons and holes may cause photon emission. The emitted photons may be reflected by the passivation layer and/or the metal reflector, and may exit micro-LED 800 from the bottom (e.g., n-type semiconductor layer 820 side) or the top (e.g., p-contact 860 side). At the sidewalls of the mesa structure, active layers 840 may have a higher density of defects, such as dislocations, dangling bonds, pores, grain boundaries, vacancies, inclusion of precipitates, and the like, due to the abrupt ending of the lattice structure and the etching. Thus, holes and electrons injected into the quantum wells of active layers 840 may recombine at the defect sites, without generating photons. As such, there may be a high leakage at the mesa side wall, and the internal/external quantum efficiency of micro-LED 800 may be low, at least due to the losses caused by the non-radiative surface recombination.

FIG. 8B illustrates a simplified energy band structure of the active layers in the active region of the example of micro-LED 800 shown in FIG. 8A. A curve 880 in FIG. 8B shows the conduction band of the active region and a curve 890 shows the valence band of the active region. The active region of micro-LED 800 may include multiple quantum well layers each sandwiched by two barrier layers. In the example shown in FIG. 8B, the conduction band and the valence band of a barrier layer are shown by a level 882 and a level 892, respectively, and the conduction band and the valence band of a quantum well layer are shown by a level 884 and a level 894, respectively. As illustrated, the quantum well layer may have a lower bandgap between the conduction band and the valence band than the barrier layer. Thus, carriers (electrons and holes) injected into the active region may be confined by the energy barriers to the quantum well layers, where the electrons and holes may recombine to emit light. The wavelength of the emitted light may depend on the bandgap of the light emitting layers (e.g., the quantum well layers). For example, in an InGaN LED, the energy bandgap of the barrier layers (e.g., GaN layer) may be higher than the energy bandgap of the quantum well layers (e.g., InGaN layers), which may decrease (and thus the wavelength of the emitted light may increase) as the proportion of Indium in InGaN increases.

In semiconductor LEDs, the internal quantum efficiency (IQE) is the ratio between the number of photons emitted and the number of carriers (electrons and holes) injected in the active region. The generated light may be extracted from the LEDs in a particular direction or within a particular solid angle. The ratio between the number of emitted photons extracted from an LED and the number of electrons passing through the LED is referred to as the external quantum efficiency (EQE), which describes how efficiently the LED converts injected electrons to photons that are extracted from the LED. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device.

The quantum efficiency of LEDs depends on the relative rates of competitive radiative (light producing) recombination and non-radiative (lossy) recombination that occur in the active region of the LEDs. Non-radiative recombination processes in the active region include Shockley-Read-Hall (SRH) recombination at defect sites, and electron-electron-hole (eeh) and/or electron-hole-hole (ehh) Auger recombination. The Auger recombination is a non-radiative process involving three carriers, which affects all sizes of LEDs. The internal quantum efficiency of an LED may be determined by:

$$IQE = \frac{BN^2}{AN + BN^2 + CN^3},$$

where A, B and C are the rates of SRH recombination, bimolecular (radiative) recombination, and Auger recombination, respectively, and N is the charge-carrier density (i.e., charge-carrier concentration) in the active region.

At the mesa sidewalls, the defect density of the active region may be very high due to the abrupt ending of the lattice structure, chemical contamination, structural damages (e.g., due to dry etch), and the like. Therefore, the non-radiative recombination (e.g., SRH recombination) rate may be high at the mesa sidewalls. For traditional, broad area LEDs used in lighting and backlighting applications (e.g., with a lateral device area about 0.1 $mm^2$ to greater than about 1 $mm^2$), the sidewalls are at the far ends of the devices. The devices can be designed such that little or no current is injected into regions within a minority carrier diffusion length from the mesa sidewalls, and thus the sidewall surface area to volume ratio and the overall rate of SRH recombination may be low.

However, in micro-LEDs where the lateral size (e.g., a diameter or side) of the mesa structure of each micro-LED may be comparable to the minority carrier diffusion length, a larger proportion of the active region may be within a distance less than the minority carrier diffusion length from the mesa sidewalls, where the defect density and the defect-induced non-radiative recombination rate may be high. Therefore, a larger proportion of the injected carriers may diffuse to the regions near the sidewall surfaces, where they may be subjected to a higher SRH recombination rate. This may cause the efficiency of the micro-LED to decrease, in particular at low current injection, and/or may cause the peak efficiency of the micro-LED to decrease and/or the peak efficiency operating current to increase. Increasing the current injection to operate closer to the peak efficiency may cause the efficiencies of the micro-LEDs to drop due to the higher eeh or ehh Auger recombination rate at a higher current density. Thus, the increased surface area to volume ratio in micro-LEDs may lead to a high non-radiative recombination rate, because a greater proportion of the total active region may fall within the minority carrier diffusion length from the micro-LED sidewalls. This can cause the leakage current of the LED to increase and the efficiency of the LED to decrease as the size of the LED decreases and/or cause the peak efficiency operating current to increase, as the size of the LED decreases. For example, for a first LED with a 100 µm×100 µm×2 µm mesa, the side-wall surface area to volume ratio may be about 0.04. However, for a second LED with a 5 µm×5 µm×2 µm mesa, the side wall surface area to volume ratio may be about 0.8, which is about 20 times higher than the first LED. Thus, with a similar surface defect density, the SRH recombination coefficient of the second LED may be about 20 times higher as well. Therefore, the efficiency of the second LED may be significantly lower than the first LED.

Figure 9:
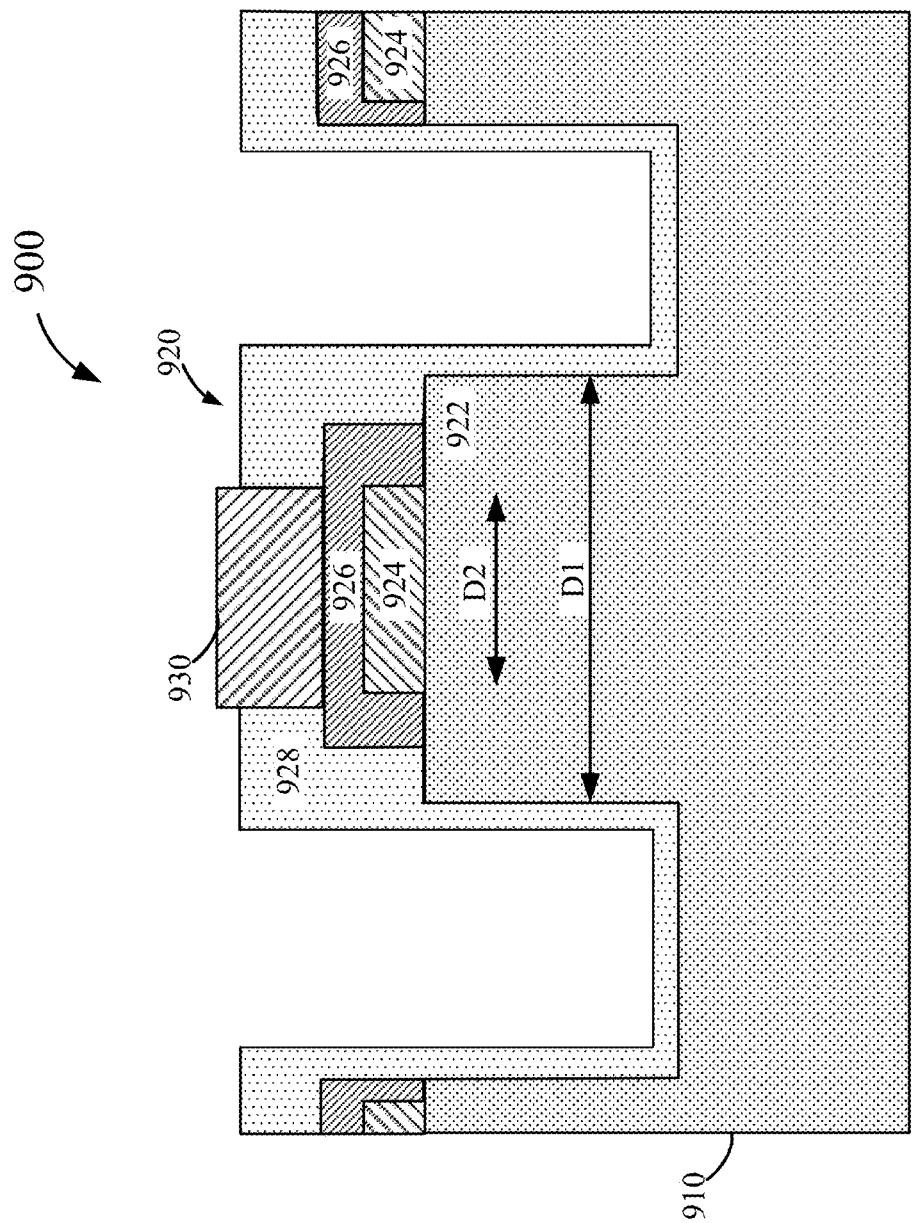
FIG. 9 illustrates an example of a micro-LED including a metal layer acting as both the p-contact and a back reflector.

FIG. 9 illustrates an example of a micro-LED 900 including a metal layer 924 acting as both the p-contact and a back reflector. Micro-LED 900 may include a mesa structure 920 formed on or in epitaxial layers 910. As described above with respect to FIGS. 7A-8B, epitaxial layers 910 may include an n-type semiconductor layer (e.g., n-type semiconductor layer 820, such an n-type GaN or another III-V semiconductor material layer), an active region (e.g., active layers 840, such as one or more InGaN/GaN layers or other III-V semiconductor material layers), and a p-type semiconductor layer (e.g., p-type semiconductor layer 850, such as a p-type GaN or another III-V semiconductor material layer). Mesa structure 920 may include a portion 922 of epitaxial layers 910, where the portion 922 may include at least a portion of the n-type semiconductor layer, the active region, and the p-type semiconductor layer.

Metal layer 924 may be formed on portion 922 (e.g., on the p-type semiconductor layer) of epitaxial layers 910. Metal layer 924 may function as the p-contact of micro-LED 900. Metal layer 924 may include a material that may have high electrical conductivity and high optical reflectivity, such as silver, aluminum, or other suitable metals or metal alloys. In one example, metal layer 924 may include silver due to its high achievable reflectance and high conductance. However, silver may have a high rate of diffusion into semiconductor layers (e.g., the InGaN/GaN layers) at the mesa sidewall regions. Thus, a high leakage current may occur at the sidewall regions of mesa structure 920. To reduce the silver diffusion into the semiconductor layers and thus the leakage current, a barrier layer 926 may be formed on the top and sidewalls of metal layer 924. Barrier layer 926 may also need to be conductive in order to connect metal layer 924 to a control or driver circuit. Barrier layer 926 may include, for example, titanium, tungsten, and the like. Barrier layer 926 may need to have a certain thickness in order to reduce the diffusion of silver into the semiconductor layers. A dielectric layer 928 may be deposited on the top and sidewall regions of mesa structure 920 to provide additional isolation. Barrier layer 926 can be used as an etch stop layer to etch vias in dielectric layer 928. The vias may then be filled with a bonding material to form metal plugs 930. The bonding material may include a metal, such as copper, for bonding micro-LED 900 to a wafer or die that includes LED driver circuits fabricated thereon as described below with respect to, for example, FIGS. 17A-19.

For a micro-LED array with a small pitch, such as less than about 4 µm or less than about 3 µm, the linear lateral dimension D1 of mesa structure 920 may be less than about 2 µm, such as less than about 1.5 µm. As such, the lateral size D2 of metal layer 924 and the width of barrier layer 926 at the sidewalls of metal layer 924 may need to be reduced. As described above, barrier layer 926 may need to have a certain thickness in order to reduce the current leakage at the edges of mesa structure 920. In addition, dielectric layer 928 may also need to use some regions of the mesa structure. For small pitch micro-LEDs, the lateral dimensions of metal layer 924 and barrier layer 926 may be very small, thus leaving very little margin for alignment error during the subsequent fabrication processes. For example, opening apertures in dielectric layer 928 to form metal plugs 930 for making electrical contacts with metal layer 924 via barrier layer 926 may reach the lithographic limit and may need very precise alignment, since the lateral size of the apertures (and metal plugs 930) may need to be smaller than the lateral size of barrier layer 926. In addition, when the pitch of the micro-LED array is reduced, the lateral size of metal layer 924 may need to be reduced more in order to leave sufficient room for barrier layer 926 and dielectric layer 928 at the sidewalls of metal layer 924 to maintain a low leakage. For example, for a micro-LED array with a pitch about 4 µm or smaller, the lateral size of metal layer 924 may need to be reduced to less than about 80% or less than about 66% of the lateral size of the active region or the mesa structure. In one example, the lateral size of the active region may be about 1.2 µm, while the lateral size of metal layer 924 may need to be reduced to about 0.8 µm or smaller. Reducing the size of metal layer 924 for the p-contact may increase the resistance of the p-contact. Moreover, as described above, metal layer 924 is also used as a reflector at the p side to reflect light emitted in the action region towards the n-type semiconductor layer of micro-LED 900, such that the emitted light may be extracted out of micro-LED 900. When the size of metal layer 924 is reduced, the overall reflectivity at the side of the p-type semiconductor layer of micro-LED 900 may decrease, such that more emitted photons may not be coupled out of micro-LED 900 from the side of the n-type semiconductor layer, thereby reducing the amount of collected light and the EQE.

Distribute Bragg reflectors (DBRs) may be used in some light emitting devices, such as some LEDs (e.g., resonant cavity LEDs) and vertical-cavity surface-emitting lasers (VCSELs), to reflect light and/or form a resonant cavity. A DBR may include alternated layers of high-index and low-index materials, such as $TiO_2$ and $SiO_2$, where each layer may have an optical thickness, for example, about a quarter of the target wavelength for normal incidence. For the target wavelength, the optical path length difference between the reflections at adjacent interfaces between the layers is about a half of the target wavelength, and the reflection coefficients at the adjacent interfaces may have alternating signs due to the alternating refractive indices. Therefore, the reflected light from the interfaces may constructively interfere, thereby resulting in a high reflectance. The reflectivity of a DBR can be higher when the difference in refractive index between the high-index and the low-index layers (referred to herein as refractive index contrast or just index contrast) is higher and/or when the number of pairs of the high-index and the low-index layers is larger.

DBRs made of dielectric materials, such as $TiO_2$ and $SiO_2$, are generally not electrically conductive. Conductive DBRs may be formed using epitaxially grown semiconductor layers with alternating doping densities, which generally have low refractive index contrast. In addition, some of these semiconductor materials may not be transparent to the emitted light due to high absorption. For large pitch light emitting devices, a DBR made of dielectric layers can be used in conjunction with metal plugs that pass through the dielectric layers to form reflective electrical contacts. For small pitch light emitting devices, the size of the metal plugs may reach the lithographic limit. In addition, it can be difficult to etch the high aspect ratio apertures through the dielectric layers and to fill the large aspect ratio apertures with metal plugs. Furthermore, a transparent current spreading layer, such as an ITO layer, may need to be formed under the dielectric DBRs to improve the electrical connectivity.

According to certain embodiments, a conductive DBR made of transparent conductive material may be used as the electrical contact (e.g., the p-contact), the back reflector, and the current spreading layer. In some examples, the conductive DBR includes layers of a same transparent conductive oxide (e.g., ITO, IZO (Indium Zinc Oxide), or AZO (Aluminum Zinc Oxide)), where the layers may have alternating refractive indices caused by different porosities and/or nanorod orientations of the transparent conductive oxide. For example, the conductive DBR may include a set of crystalline ITO layers (e.g., having a first refractive index that may be tuned to an appropriate value, such as about 2.2 or another desired value, by changing the porosity of the ITO layers) interleaved with a set of porous ITO layers (e.g., having a second refractive index that may be tuned to an appropriate value, such as about 1.5 or another desired value, by changing the porosity of the ITO layers). In some embodiments, the conductive DBR may include layers of different transparent conductive oxides that have different refractive indices. Due to the high refractive index contrast between adjacent layers, the conductive DBR can achieve a high reflectance (e.g., >90% or >95%, such as close to 99% or 100%, which is tunable by changing the number of layers) using a relatively small number of layers, and thus may have a low overall thickness and also a low resistance.

Furthermore, because no metal p-contact reflector (e.g., a silver layer) is used, the barrier layer (e.g., barrier layer 926 shown in FIG. 9) for the diffusive reflective metal would not be needed. As such, the conductive DBR can have about the same lateral size as the epitaxial layers in the mesa structure to reduce the contact resistance and increase the overall reflectance of the back reflector at the electrical contact (e.g., the p-contact), such that almost all emitted light passing through the p-type semiconductor layer may be reflected back towards the n-type semiconductor layer and the light emitting surface of the LED.

In addition, because the conductive DBR has about the same lateral size as the epitaxial layers in the mesa structure, the conductive DBR layer and the epitaxial layers can be etched in a same etching process or different etching steps using a same etch mask to form the individual mesa structures. Therefore, no alignment may be needed to form the conductive DBR on the epitaxial layers in each mesa structure.

As such, for the LED structures disclosed herein, the pitch and the mesa size may not be restricted by the thickness of the barrier layer and/or the lithographic limit associated with the fabrication of the metal layer (e.g., metal layer 924), the barrier layer (e.g., barrier layer 926), the dielectric layer (e.g., dielectric layer 928), and/or the metal plugs described above. In addition, the risk of misalignments during the fabrication of the mesa structures, the reflectors, and the electrical contacts may be eliminated. Therefore, the pitch and the mesa size of the LEDs may be reduced to small values and the LEDs may still be reliably fabricated. Furthermore, since the conductive DBR acts as the electrical contact (e.g., the p-contact), the current spreading layer, and the back reflector that can cover the whole active region of the mesa structure to reflect all light passing through the p-type semiconductor layer, a high total reflectance and low resistance may still be achieved even if the pitch and the mesa size of the micro-LEDs are reduced to small values, such as a few microns or about one micron. Thus, the micro-LED structures disclosed herein are highly scalable, and may be well suited for small-pitch micro LEDs, such as micro-LEDs with pitches less than about 4 µm or less than about 3 µm.

Figure 10:
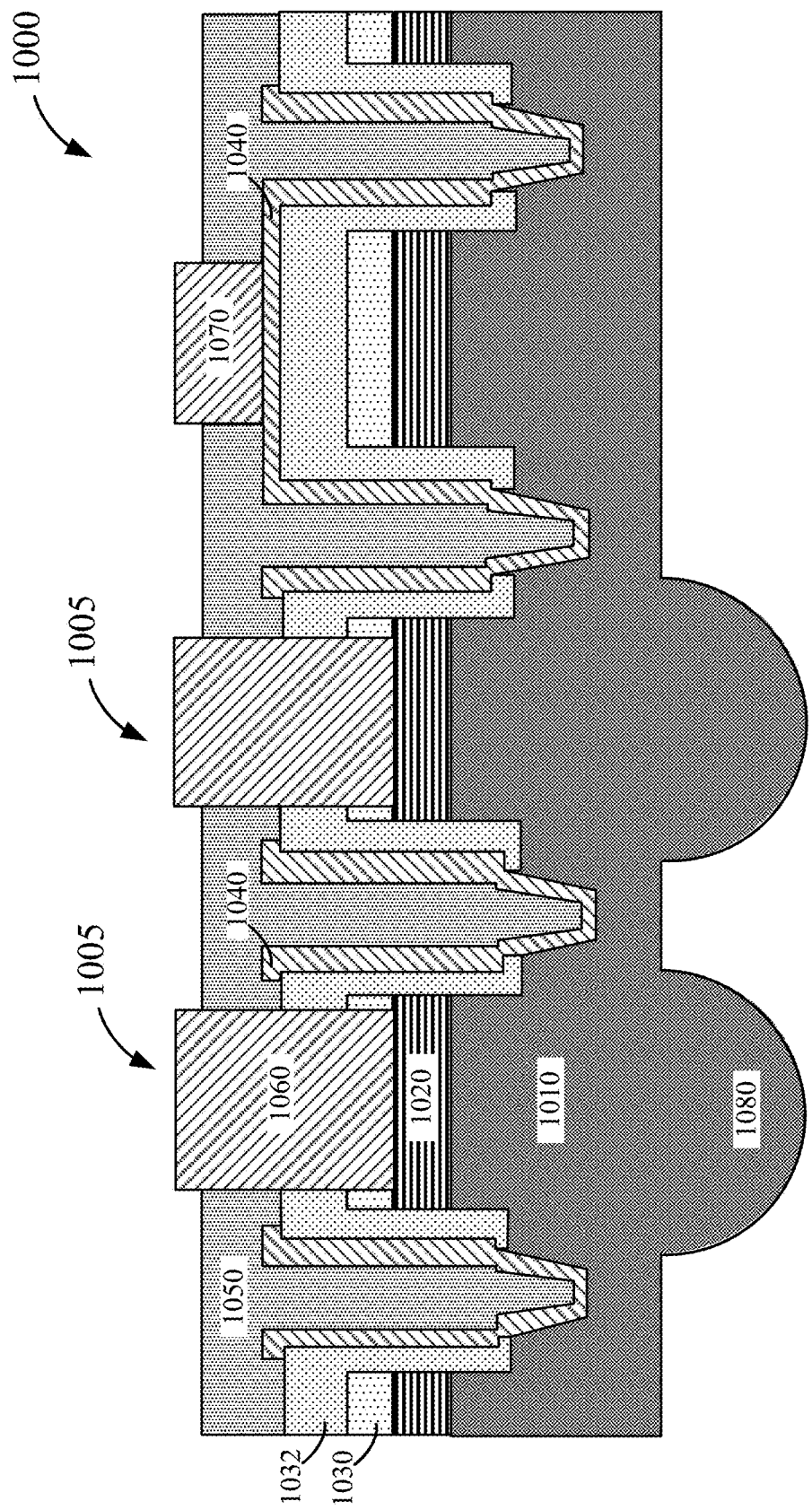
FIG. 10 illustrates an example of a micro-LED device including a conductive DBR structure acting as both the p-contact and a back reflector according to certain embodiments.

FIG. 10 illustrates an example of a micro-LED device 1000 including a conductive DBR structure acting as both the p-contact and a back reflector according to certain embodiments. Micro-LED device 1000 may include an array of micro-LEDs 1005 formed on epitaxial layers 1010. As described above with respect to FIGS. 7A-8, epitaxial layers 1010 may include an n-type semiconductor layer (e.g., n-type semiconductor layer 820, such an n-type GaN or another III-V semiconductor material layer), an active region (e.g., active layers 840, such as one or more InGaN/GaN layers or other III-V semiconductor material layers), and a p-type type semiconductor layer (e.g., p-type semiconductor layer 850, such as a p-type GaN or another III-V semiconductor material layer). Conductive DBR layers 1020 may be formed on epitaxial layers 1010 and may include transparent conductive oxide layers having alternating refractive indices as described above and in more details below. An oxide layer 1030 may be formed on conductive DBR layers 1020.

Oxide layer 1030, conductive DBR layers 1020, and at least a portion of epitaxial layers 1010 that may include the p-type semiconductor layer, the active region, and a portion of the n-type semiconductor layer may be etched in a same etch step or in multiple etch steps but using the same etch mask to form individual mesa structures for individual micro-LEDs 1005. As such, a conductive DBR structure etched in conductive DBR layers 1020 may fully cover the epitaxial layers in each mesa structure as shown in FIG. 10, or may cover at least 80% or at least 90% of the lateral region of the epitaxial layers. A dielectric layer 1032 (e.g., a passivation layer, such as $SiO_2$) may be deposited on the top and the sidewalls of the mesa structures. The regions between the mesa structures may be etched to expose the n-type semiconductor layer in epitaxial layers 1010. A metal layer 1040 (e.g., an aluminum layer) may be formed on the sidewalls of dielectric layer 1032, on the surfaces of the exposed n-type semiconductor layer, and on top of some regions of dielectric layer 1032. Metal layer 1040 may be used as a current spreading layer and n-contacts for micro-LEDs 1005, and may also form sidewall reflectors for coupling the emitted light out of micro-LEDs 1005.

Metal plugs 1060 may be formed in dielectric layers 1032 and 1030 and may contact conductive DBR layer 1020. Metal plugs 1060 may act as the p-electrodes and may be used to bond with bonding pads or traces on a wafer or die that includes LED driver circuits fabricated thereon as described below with respect to, for example, FIGS. 17A-19. Metal plugs 1070 may also be formed in dielectric layers 1032 and 1030 to connect with metal layer 1040, which is electrically connected to n-type semiconductor layer of micro-LEDs 1005 as described above. Metal plugs 1070 may act as the n-electrodes and may be used to bond with bonding pads or traces on the wafer or die that includes LED driver circuits fabricated thereon as described below with respect to, for example, FIGS. 17A-19.

Light extraction structures 1080, such as micro-lenses and/or antireflective coating layers, may be formed on the side of the n-type semiconductor layer in epitaxial layers 1010. Light extraction structures 1080 may be etched in epitaxial layers 1010 and/or the substrate on which epitaxial layers 1010 are grown, or may be formed in a dielectric, semiconductor, or organic material layer deposited on the n-type semiconductor layer of epitaxial layers 1010 (e.g., after removing or thinning the substrate on which epitaxial layers 1010 are grown).

Figure 11B:
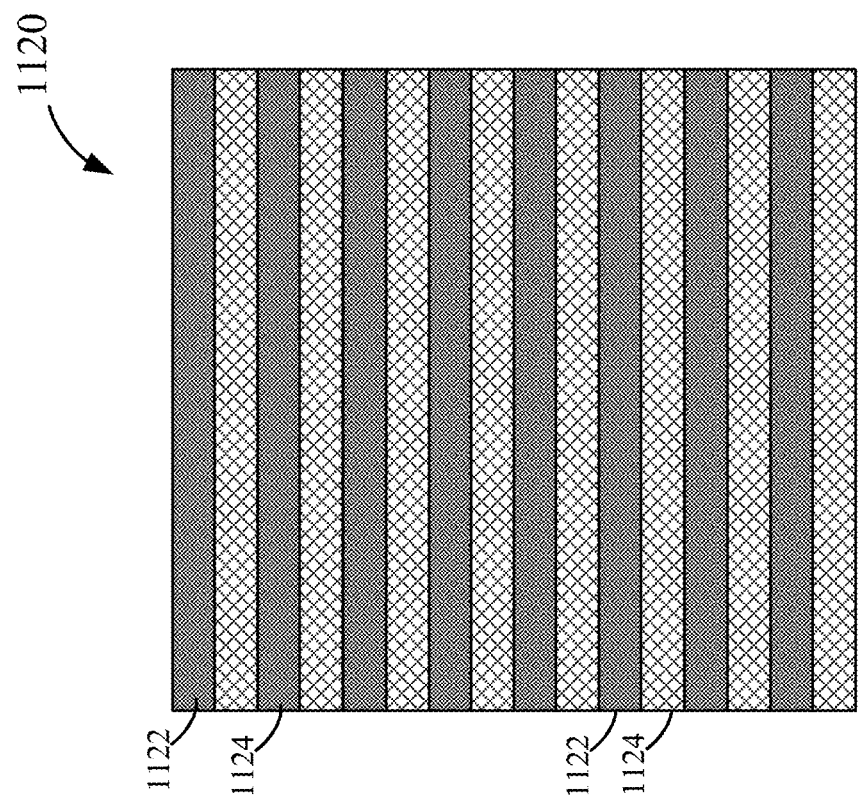
FIG. 11B illustrates an example of a conductive DBR structure including indium tin oxide (ITO) layers having different porosities according to certain embodiments.
Figure 11A:
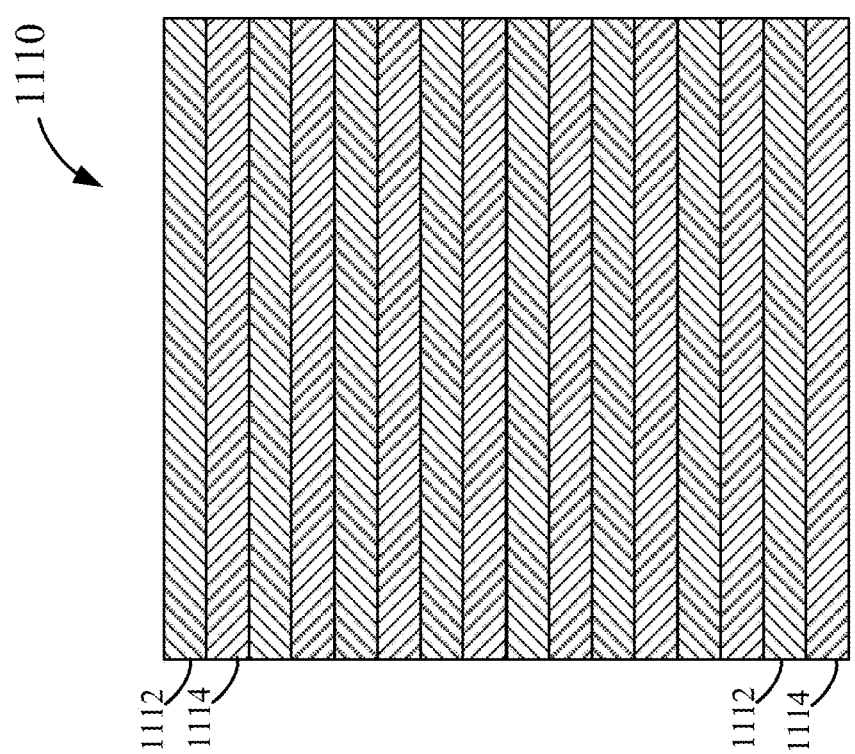
FIG. 11A includes an example of a conductive DBR structure including indium tin oxide (ITO) layers having different nanorod orientations according to certain embodiments.

FIG. 11A illustrates an example of a conductive DBR structure 1110 including transparent and conductive ITO thin films having different nanorod orientations according to certain embodiments. Conductive DBR structure 1110 may be an example of the conductive DBR structure shown in FIG. 10. In the illustrated example, conductive DBR structure 1110 includes multiple (e.g., 6, 8, or more) pairs of layers 1112 and 1114. Layers 1112 may include ITO films with a certain nanorod orientation, while layers 1114 may include ITO films with a different nanorod orientation. Each of the ITO films of layers 1112 and 1114 may be deposited on the underlying layer (e.g., epitaxial layers 1010) at angles ranging from, for example, about 0° to about ±75° using deposition techniques such as electron-beam evaporation. At large vapor incident angles, deposited nanorods may prevent deposition in areas of the underlying layer that are shadowed by the deposited nanorods, thereby forming a porous ITO film. The feature sizes of the nanorods and the voids between the nanorods in the porous ITO film may be small compared to the working wavelength, and thus the porous ITO film may be described by an effective refractive index. In general, the larger the vapor incident angles, the larger the voids of the deposited ITO film may be, and thus the lower the effective refractive index of the deposited ITO film may be. In some embodiments, the deposited ITO films may be annealed in an oxygen atmosphere.

In one example, a first layer 1114 may include an ITO film deposited at a vapor incident angle about 75°, and may have an effective refractive index about 1.5 for light having a wavelength about 460 nm (blue light). A first layer 1112 may be deposited on the first layer 1114 at a vapor incident angle about −45°, and may include an ITO film having an effective refractive index about 1.9 for light having a wavelength about 460 nm (blue light). A second layer 1114 may then be deposited on the first layer 1112 at a vapor incident angle about 75° to form another low refractive index ITO film. A second layer 1112 may be deposited on the second layer 1114 at a vapor incident angle about −45° to form another high refractive index ITO film. The deposition process may be performed repeatedly to form other pairs of layers 1114 and 1112. The number of pairs of layers 1114 and 1112 used in conductive DBR structure 1110 may be determined based on, for example, the desired reflectivity, the refractive index contrast between layer 1112 and layer 1114, the working wavelength, the desired total thickness of the conductive DBR structure, and the like. As described above, the thickness of each layers 1112 and 1114 may be selected such that the light reflected at the interfaces between the adjacent layers may constructively interfere to enhance the reflection.

FIG. 11B illustrates another example of a conductive DBR structure 1120 including transparent conductive ITO thin films having different porosities according to certain embodiments. Conductive DBR structure 1120 may be an example of the conductive DBR structure shown in FIG. 10. In the illustrated example, conductive DBR structure 1120 includes multiple (e.g., 4, 6, 8, or more) pairs of layers 1122 and 1124. For example, with a refractive index contrast about 0.7, a 90% reflectance can be achieved using only 4 pairs of layers, which may have a total thickness of about 520 nm, 590 nm, and 710 nm for blue, green, and red light, respectively. Thinner DBR stacks can be easier to fabricate. When 8 or more pairs of layers with refractive index contrast about 0.7 are used, the reflectance can be about 100%. Layers 1122 may include ITO films with a certain porosity, while layers 1114 may include ITO films with a different porosity. For example, each layer 1122 may include a dense crystalline ITO thin film, whereas each layer 1124 may include a porous ITO thin film.

In one example, the dense crystalline ITO thin films (e.g., layers 1122) may be deposited by a long-throw radio frequency (RF) magnetron sputtering technique. In the long-throw RF sputtering process, the sputtered particles may be thermalized and may reach a substrate (e.g., a wafer with epitaxial layers grown thereon) by diffusion when the target-to-substrate distance is large. The long-throw RF sputtering technique can achieve a high thickness uniformity of the deposited film. In addition, in the long-throw RF sputtering, the substrate can be at a low temperature because the target-to-substrate distance is large. The dense crystalline ITO thin film formed by the long-throw RF sputtering process may have a high refractive index, such as about 2.2 for light having a wavelength about 460 nm (blue light).

The porous ITO thin films (e.g., layers 1124) may be made by, for example, extracting organic matters from gel-coated films using high polarity supercritical $CO_2$ fluids that may include a small amount of polar cosolvents, such as Isopropyl alcohol (IPA), mixed with nonpolar $CO_2$ fluids. The mixed solvents may greatly enhance the solubility of polar solutes in the mixed solvents even at a low process temperature. Layers 1122 and 1124 may be alternately formed on the substrate to form conductive DBR structure 1120. The porous ITO thin film may have a low refractive index, such as about 1.51 for light having a wavelength about 460 nm (blue light).

The number of pairs of layers 1124 and 1122 may be determined based on, for example, the desired reflectivity, the refractive index contrast between layer 1122 and layer 1124, the working wavelength, the desired total thickness of conductive DBR structure 1120, and the like. As described above, the thickness of each layers 1122 and 1124 may be selected such that the light reflected at the interfaces between the adjacent layers may constructively interfere to achieve a high reflectance.

Figure 12A:
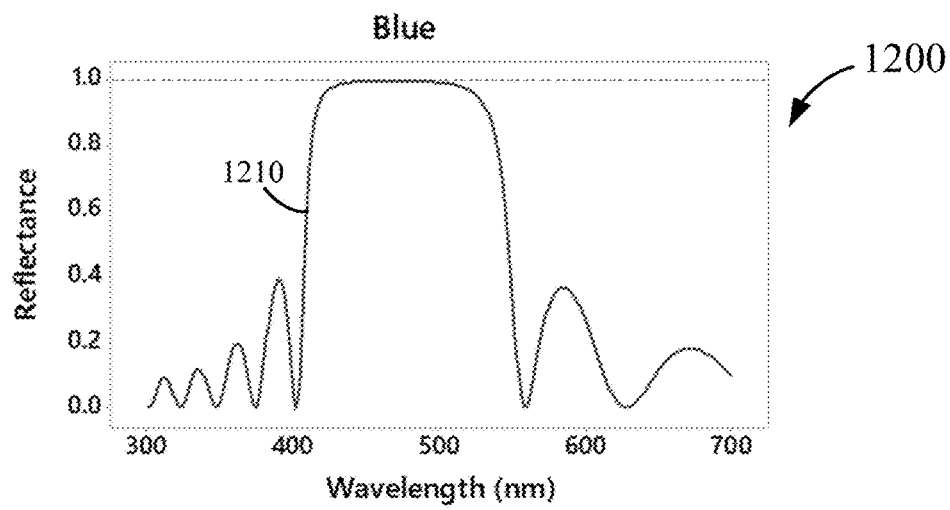
FIG. 12A illustrates the simulated reflectance of an example of a conductive DBR structure according to certain embodiments.

FIG. 12A includes a diagram 1200 illustrating the reflectance of an example of a conductive DBR structure for blue light according to certain embodiments. The conductive DBR structure may be an example of conductive DBR structure 1120 and may include 8 pairs of layer 1122 and layer 1124. The conductive DBR structure can be designed to reflect any target wavelength (e.g., UV, blue, green, red, etc.). In the illustrated example, the conductive DBR structure may be designed for a target wavelength about 460 nm. The refractive index of each layer 1122 may be about 2.2 for the target wavelength, whereas the refractive index of each layer 1124 may be about 1.51 for the target wavelength. A curve 1210 in diagram 1200 shows the reflectance of the conductive DBR structure for different wavelengths. As illustrated, the conductive DBR structure may have a reflectance close to about 100% at the target wavelength.

Figure 12B:
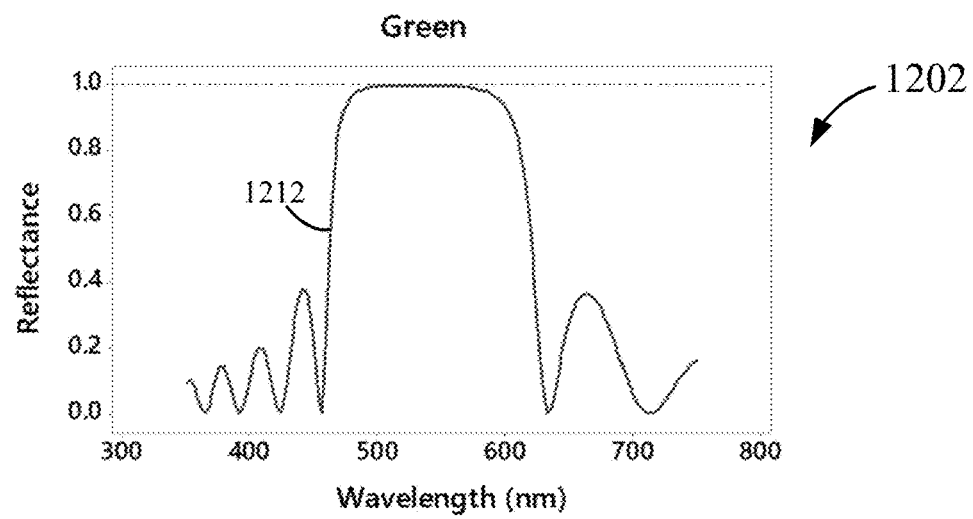
FIG. 12B illustrates the simulated reflectance of another example of a conductive DBR structure according to certain embodiments.

FIG. 12B includes a diagram 1202 illustrating the reflectance of an example of a conductive DBR structure for green light according to certain embodiments. The conductive DBR structure may be an example of conductive DBR structure 1120 and may include 8 pairs of layer 1122 and layer 1124. In the illustrated example, the conductive DBR structure may be designed for a target wavelength about 550 nm (green light). The refractive index of each layer 1122 may be about 2.2 for the target wavelength, whereas the refractive index of each layer 1124 may be about 1.51 for the target wavelength. A curve 1212 in diagram 1202 shows the reflectance of the conductive DBR structure for different wavelengths. As illustrated, the conductive DBR structure may have a reflectance close to about 100% for green light.

Figure 12C:
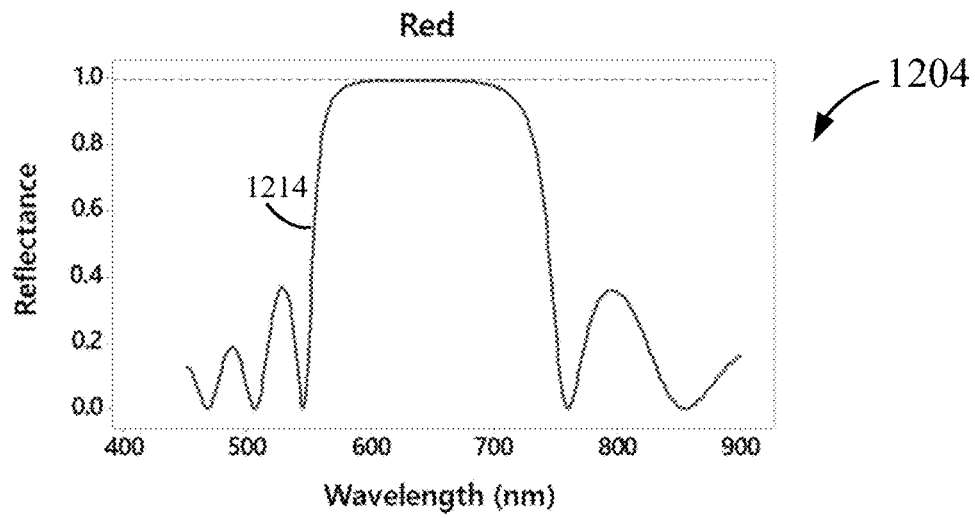
FIG. 12C illustrates the simulated reflectance of another example of a conductive DBR structure according to certain embodiments.

FIG. 12C includes a diagram 1204 illustrating the reflectance of an example of a conductive DBR structure for red light according to certain embodiments. The conductive DBR structure may be an example of conductive DBR structure 1120 and may include 8 pairs of layer 1122 and layer 1124. In the illustrated example, the conductive DBR structure may be designed for a target wavelength about 650 nm (red light). The refractive index of each layer 1122 may be about 2.2 for the target wavelength, whereas the refractive index of each layer 1124 may be about 1.51 for the target wavelength. A curve 1214 in diagram 1204 shows the reflectance of the conductive DBR structure for different wavelengths. As illustrated, the conductive DBR structure may have a reflectance close to about 100% for red light.

FIGS. 13A-13F illustrate an example of a self-aligned process for fabricating a micro-LED device including a conductive DBR structure, such as micro-LED device 1000, according to certain embodiments. FIG. 13A shows a substrate 1310 that may include a base wafer (e.g., a silicon or sapphire wafer) with epitaxial layers formed thereon. As described above, the epitaxial layers may include, for example, an optional buffer layer, an n-type semiconductor layer (e.g., an n-GaN layer), active layers (e.g., one or more quantum well layers and one or more barrier layers), and a p-type semiconductor layer (e.g., a p-GaN layer). Conductive DBR layers 1320 may be formed on substrate 1310. For example, conductive DBR layers 1320 may be formed on the p-type semiconductor layer of substrate 1310. An oxide layer 1330, such as a SiO2 layer, may be deposited on conductive DBR layers 1320. In one example, oxide layer 1330 may have a thickness about 100 to about 200 nm.

As described above, conductive DBR layers 1320 may include transparent conductive oxide layers (e.g., ITO, IZO, AZO, etc.) having alternating refractive indices. For example, conductive DBR layers 1320 may include a set of sputtered crystalline ITO thin films interleaved with a set of porous ITO thin films as described above with respect to FIG. 11B. The sputtered crystalline ITO thin films may have a high refractive index, such as about 2.2. The porous ITO thin films may have a low refractive index, such as about 1.51. Thus, a refractive index contrast about 0.7 may be achieved, such that a smaller number of conductive DBR layers may be used to achieve the desired reflectance. In another example, conductive DBR layers 1320 may include a set of ITO thin films (having a first nanorod orientation and a low refractive index) interleaved with a set of ITO thin films having a different nanorod orientation and a high refractive index as described above with respect to FIG. 11A. Conductive DBR layers 1320 may include multiple pairs (e.g., more than 3 pairs, more than 5 pairs, or more than 6 pairs, such as 6 to 8 or more pairs) of a high refractive index transparent conductive oxide (e.g., sputtered crystalline ITO) layer and a low refractive index transparent conductive oxide (e.g., porous ITO) layer in order to achieve the desired reflectance, such as greater than about 90%, greater than about 95%, greater than about 98%, greater than about 99%, or higher. The total thickness of conductive DBR layers 1320 may be less than about 1 µm.

FIG. 13B shows that mesa structures 1302 may be etched in oxide layer 1330, conductive DBR layers 1320, and at least a portion of substrate 1310. The etching may be performed in a single dry etch step or in multiple etch steps using the same etch mask. Thus, the conductive DBR structure and the epitaxial layers in each mesa structure may have the same or similar lateral dimension. For example, the conductive DBR structure may cover at least 80% or at least 90% of the lateral region of the epitaxial layers in each mesa structure. Mesa structures 1302 may have a small pitch, such as less than about 5 µm, less than about 4 µm, less than about 3 µm, less than about 2 µm, or smaller. The linear lateral size of mesa structures 1302 may be less than about 3 µm, less than about 2 µm, less than about 1.5 µm, or smaller.

FIG. 13C shows a dielectric layer 1332 (e.g., a SiO2 layer) formed on the top surfaces and the sidewall surfaces of mesa structures 1302. Dielectric layer 1332 may be conformally deposited on the top surfaces and the sidewall surfaces of mesa structures 1302 and the exposed surfaces of the epitaxial layers in substrate 1310 by a deposition process, such as a chemical vapor deposition (CVD) or atomic layer deposition (ALD) process. In some embodiments, dielectric layer 1332 may be deposited to fill the gaps between mesa structures 1302 and may then be etched to form trenches in the regions between mesa structures 1302 while leaving some dielectric materials on the sidewalls of mesa structures 1302. Dielectric layer 1332 at the bottom of the trenches in the regions between mesa structures 1302 may be etched, for example, using the oxide (e.g., dielectric layer 1332) on top of mesa structures 1302 as the etch mask, to expose the n-type semiconductor layer. In some embodiments, the n-type semiconductor layer may be further etched to form U-shaped, V-shaped, or parabolic shaped voids in the n-type semiconductor layer for making n-contacts and sidewall reflectors in the subsequent processes.

FIG. 13D shows that a metal layer 1340 may be conformally deposited on the surfaces of mesa structure 1302 and the voids formed in the n-type semiconductor layer. Metal layer 1340 may include a metal that has a high conductivity and a high reflectivity. In one example, metal layer 1340 may include an aluminum layer. Metal layer 1340 may be patterned, for example, to remove metal layer 1340 in certain regions, such as metal layer 1340 on the top of mesa structure 1302 for each micro-LED. Metal layer 1340 may function as a current spreading layer, the n-contacts, and sidewall reflectors for the micro-LEDs.

FIG. 13E shows that a dielectric layer 1350 may be deposited on the structure shown in FIG. 13D. Dielectric layer 1350 may include, for example, a SiO2 layer. Dielectric layer 1350 may be a thick dielectric layer and may fill the gaps between metal layer 1340. The thickness of dielectric layer 1350 on top of dielectric layer 1332 may be, for example, about 1 µm.

FIG. 13F shows that dielectric layer 1350 (and layers 1330 and 1332) may be etched to form apertures on top of mesa structures 1302, and the apertures may be filled with a metal (e.g., aluminum, titanium, copper, etc.) to form p-electrodes 1360 that contact the conductive DBR structures formed in conductive DBR layers 1320. Similarly, some areas of dielectric layer 1350 may be etched to form apertures, and the apertures may be filled with a metal (e.g., aluminum, titanium, copper, etc.) to form one or more n-electrodes 1370 that contact metal layer 1340.

FIG. 13F also shows that light extraction structures 1380, such as micro-lenses, may be formed on the bottom side of substrate 1310 to improve the light extraction efficiency. In some embodiments, light extraction structures 1380 may be formed after the manufactured wafer is bonded to a CMOS backplane (e.g., a silicon wafer with driver and control circuits fabricated thereon), and/or after the base wafer (e.g., the silicon or sapphire wafer) is thinned or removed. Light extraction structures 1380 may be etched in substrate 1310, or may be formed in a dielectric, semiconductor, or organic material layer deposited on the side of the n-type semiconductor layer of the epitaxial layers.

FIGS. 14A-14F illustrate another example of a self-aligned process for fabricating a micro-LED device including a conductive DBR structure according to certain embodiments. FIG. 14A shows a substrate 1410 that includes a base wafer (e.g., a silicon or sapphire wafer) and epitaxial layers formed thereon. As described above, the epitaxial layers may include, for example, an optional buffer layer, an n-type semiconductor layer (e.g., an n-GaN layer), active layers (e.g., one or more quantum well layers and one or more barrier layers), and a p-type semiconductor layer (e.g., a p-GaN layer). Conductive DBR layers 1420 may be formed on substrate 1410. For example, conductive DBR layers 1420 may be formed on the p-type semiconductor layer of substrate 1410.

As described above, conductive DBR layers 1420 may include transparent conductive oxide layers (e.g., ITO, IZO, AZO, etc.) that have alternating refractive indices. For example, conductive DBR layers 1420 may include a set of sputtered crystalline ITO thin films interleaved with a set of porous ITO thin films as described above with respect to FIG. 11B. The sputtered crystalline ITO thin films may have a high refractive index, such as about 2.2. The porous ITO thin films may have a low refractive index, such as about 1.51. Thus, a refractive index contrast about 0.7 may be achieved, such that a smaller number of conductive DBR layers may be used to achieve the desired reflectance. In another example, conductive DBR layers 1420 may include a set of ITO thin films having a first nanorod orientation (and a low refractive index) interleaved with a set of ITO thin films with a different nanorod orientation (and a high refractive index) as described above with respect to FIG. 11A. Conductive DBR layers 1420 may include multiple pairs (e.g., more than 3 pairs, more than 5 pairs, or more than 6 pairs, such as 6 to 8 or more pairs) of a high refractive index transparent conductive oxide (e.g., sputtered crystalline ITO) layer and a low refractive index transparent conductive oxide (e.g., porous ITO) layer in order to achieve the desired reflectance, such as greater than about 90%, greater than about 95%, greater than about 98%, greater than about 99%, or higher. The total thickness of conductive DBR layers 1420 may be less than about 1 µm.

FIG. 14B shows that mesa structures 1402 may be etched in conductive DBR layers 1420 and at least a portion of substrate 1410. The etching may be performed in a single dry etch step or in multiple etch steps using the same etch mask. Thus, the conductive DBR structure formed in conductive DBR layers 1420 and the epitaxial layers in each mesa structure may have the same or similar lateral dimensions. For example, the conductive DBR structure may cover at least 80% or at least 90% of the lateral region of the epitaxial layers in each mesa structure. Mesa structures 1402 may have a small pitch, such as less than about 5 µm, less than about 4 µm, less than about 3 µm, less than about 2 µm, or smaller. The linear lateral size of mesa structures 1402 may be less than about 3 µm, less than about 2 µm, less than about 1.5 µm, or smaller.

FIG. 14C shows a dielectric layer 1430 (e.g., a $SiO_2$ layer) formed on the top surfaces and the sidewall surfaces of mesa structures 1402, and on regions between mesa structures 1402. Dielectric layer 1430 may function as a passivation and isolation layer at the sidewalls of mesa structures 1402. Dielectric layer 1430 may have a thickness, for example, about 100 to about 200 nm. Dielectric layer 1430 may be conformally deposited on the top surfaces and the sidewall surfaces of mesa structures 1402 by a deposition process, such as a CVD or ALD process. A metal layer 1440 may be conformally deposited on the surfaces of dielectric layer 1430. Metal layer 1440 may include a metal that has a high conductivity and a high reflectivity. In one example, metal layer 1440 may include an aluminum layer. Metal layer 1440 may be patterned, for example, to remove metal layer 1440 in certain regions, such as metal layer 1440 on top of mesa structure 1402 for each micro-LED. Metal layer 1440 may function as a current spreading layer, n-contacts, and sidewall reflectors for the micro-LEDs.

FIG. 14D shows that a dielectric layer 1450 may be deposited on the structure shown in FIG. 14D. Dielectric layer 1450 may include, for example, a $SiO_2$ layer. Dielectric layer 1450 may be a thick dielectric layer and may fill the gaps between metal layer 1440. The thickness of dielectric layer 1450 on top of dielectric layer 1430 may be, for example, about 1 µm.

FIG. 14E shows that dielectric layer 1450 and dielectric layer 1430 may be etched to form apertures (e.g., trenches) on top of mesa structures 1402, and the apertures may be filled with a metal (e.g., aluminum, titanium, copper, etc.) to form p-electrodes 1460 that contact the conductive DBR structures formed in conductive DBR layers 1420. In some embodiments, some areas of dielectric layer 1450 may be etched to form apertures, and the apertures may be filled with a metal (e.g., aluminum, titanium, copper, etc.) to form n-electrodes (not shown in FIG. 14E) that contact metal layer 1440.

FIG. 14F shows that light extraction structures 1470, such as micro-lenses, may be formed on the bottom side of substrate 1410 to improve the light extraction efficiency. In some embodiments, light extraction structures 1470 may be formed after the manufactured wafer is bonded to a silicon wafer with driver and control circuits fabricated thereon, and/or after the base wafer (e.g., the silicon or sapphire wafer) is thinned or removed. Light extraction structures 1470 may be etched in substrate 1410, or may be formed in a dielectric, semiconductor, or organic material layer deposited on the n-type semiconductor layer.

In addition, substrate 1410 and dielectric layer 1430 may be etched from the side of the n-type semiconductor layer to expose metal layer 1440. A transparent conductive oxide layer 1480 may then be formed on the surfaces of light extraction structures 1470, the exposed surface of substrate 1410 (e.g., the n-type semiconductor layer), and the exposed surfaces of metal layer 1440, to form the n-contacts and a current spreading layer for the n-contacts.

Figure 15:
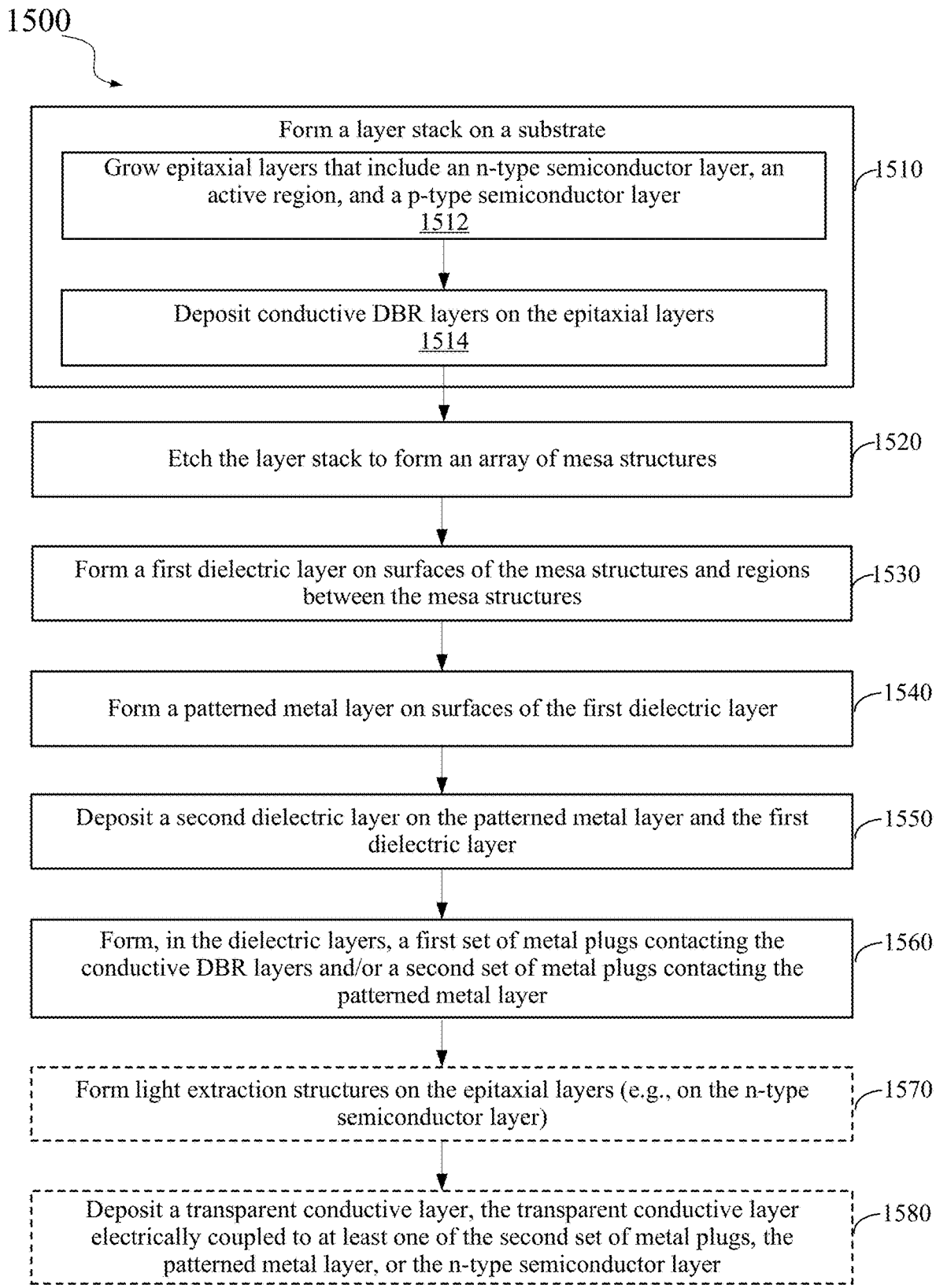
FIG. 15 includes a flowchart illustrating an example of a self-aligned process for fabricating a micro-LED device including a conductive DBR structure acting as both the electrical contact and a back reflector according to certain embodiments.

FIG. 15 includes a flowchart 1500 illustrating an example of a self-aligned process for fabricating a micro-LED device including a conductive DBR structure acting as both the electrical contact (e.g., p-contact) and a back reflector according to certain embodiments. It is noted that the operations illustrated in FIG. 15 provide particular processes for fabricating micro-LEDs. Other sequences of operations can also be performed according to alternative embodiments. For example, alternative embodiments may perform the operation in a different order. Moreover, the individual operations illustrated in FIG. 15 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

Operations in block 1510 of flowchart 1500 may include forming a layer stack on a substrate (e.g., a silicon or sapphire wafer). The layer stack may include a plurality of epitaxial layers and a plurality of transparent conductive oxide layers that form a conductive DBR. Forming the layer stack may include, at block 1512, growing the plurality of epitaxial layers that includes an n-type semiconductor layer, an active region configured to emit visible light having a first wavelength, and a p-type semiconductor layer. Forming the layer stack may also include, at block 1514, depositing the plurality of transparent conductive oxide layers on the plurality of epitaxial layers. The plurality of transparent conductive oxide layers may include a first set of transparent conductive oxide layers characterized by a first refractive index, and a second set of transparent conductive oxide layers characterized by a second refractive index and interleaved with the first set of transparent conductive oxide layers, where a reflectance of the conductive DBR for the first wavelength is greater than 90%, greater than about 95%, or greater than about 98%. The first set of transparent conductive oxide layers may include a first set of ITO layers. The second set of transparent conductive oxide layers may include a second set of ITO layers. The first set of ITO layers and the second set of ITO layers may have different porosities or different nanorod orientations as described above. In some embodiments, a dielectric (e.g., oxide) layer may be formed on the conductive DBR.

Operations at block 1520 may include etching the layer stack to form an array of mesa structures. The array of mesa structures may be characterized by a pitch equal to or less than about 4 µm, less than about 3 µm, or less than about 2 µm. Each mesa structure may be characterized by a linear lateral dimension less than about 3 µm, less than about 2 µm, or less than about 1.5 µm. The layer stack may be etched through the plurality of transparent conductive oxide layers and at least some of the plurality of epitaxial layers. For example, the n-type semiconductor layer may be partially etched. The etching may be performed in a single etch step or in multiple etch steps but using the same etch mask. As such, the conductive DBR and the epitaxial layers in each mesa structure may have similar or same lateral dimensions. For example, the conductive DBR may cover at least 80% or at least 90% of the lateral region of the epitaxial layers in each mesa structure.

At block 1530, a first dielectric layer (e.g., $SiO_2$) may be formed on surfaces (e.g., top and sidewall surfaces) of the mesa structures and regions between the mesa structures. The first dielectric layer may function as a passivation and isolation layer at the sidewalls of the mesa structures. The first dielectric layer may have a thickness, for example, about 100 to about 200 nm. The first dielectric layer may be conformally deposited on the top surfaces and the sidewall surfaces of the mesa structures by a deposition process, such as a CVD process or an ALD process.

At block 1540, a patterned metal layer may be formed on surfaces of the first dielectric layer. For example, a metal layer may be conformally deposited on the surfaces of the first dielectric layer. The metal layer may include a metal that has a high conductivity and a high reflectivity, such as aluminum. The metal layer may be patterned, for example, to remove the metal layer in certain regions, such as the metal layer on top of the mesa structure for each micro-LED. The metal layer may function as a current spreading layer, n-contacts, and/or sidewall reflectors for the micro-LEDs.

At block 1550, the operation may include depositing a second dielectric layer on the patterned metal layer and the first dielectric layer. The second dielectric layer may include, for example, a $SiO_2$ layer. The second dielectric layer may be a thick dielectric layer and may fill the gaps between the metal layer in regions between the mesa structures. The thickness of the second dielectric layer on top of the first dielectric layer may be, for example, about 1 µm.

Operations at block 1560 may include forming, in the dielectric layers, a first set of metal plugs (e.g., p-electrodes) contacting the conductive DBR and/or a second set of metal plugs (e.g., n-electrodes) contacting the patterned metal layer. For example, the dielectric layers on top of each mesa structure may be etched to form an aperture (e.g., a trench), and the aperture may be filled with a metal (e.g., aluminum, titanium, copper, etc.) to form a p-electrode that contacts the conductive DBR. In some embodiments, some areas of the second dielectric layer on top of the patterned metal layer may be etched to form apertures, and the apertures may be filled with a metal (e.g., aluminum, titanium, copper, etc.) to form n-electrodes that contact the patterned metal layer.

Optionally, at block 1570, light extraction structures, such as micro-lenses, may be formed on the epitaxial layers (e.g., on the n-type semiconductor layer). In some embodiments, the light extraction structures may be formed after the processed wafer including the micro-LEDs is bonded to a silicon wafer (e.g., a CMOS backplane) with driver and control circuits fabricated thereon, and/or after the substrate (e.g., the silicon or sapphire wafer) is thinned or removed. The CMOS backplane may have bonding pads formed thereon. Bonding pads on the CMOS backplane and the metal plugs on the processed wafer or die may be bonded together. In some embodiments, the gap between the wafer or die including the micro-LEDs and the CMOS backplane may be filled with a non-conductive material, such as a dielectric material or an organic material (e.g., an epoxy or a resin). In some embodiments, the surface of the CMOS backplane and the surface of the wafer or die including the micro-LEDs may each include a dielectric layer and the two dielectric layers may also be bonded together in a hybrid bonding process. The substrate of the micro-LEDs (e.g., the silicon or sapphire wafer) may then be thinned or removed from the bonded device. The light extraction structures (e.g., micro-lenses) may be formed on the light emitting side of the bonded device. For example, the light extraction structures may be etched in the epitaxial layers, or may be formed in a dielectric, semiconductor, or organic material layer deposited on the side of the n-type semiconductor layer of the epitaxial layers.

Optionally, at block 1580, a transparent conductive layer (e.g., an ITO layer) may be deposited on the light emitting side of the bonded device. In some embodiments, the epitaxial layers (e.g., the n-type semiconductor layer) and the first dielectric layer in regions between the mesa structures may be etched from the side of the n-type semiconductor layer to expose the metal layer, before the transparent conductive layer is deposited. Thus, the transparent conductive layer may be electrically coupled to at least one of the patterned metal layer, the n-type semiconductor layer, or the second set of metal plugs (e.g., through the patterned metal layer). The transparent conductive layer and/or the patterned metal layer may be used to spread the current between the n-contacts of the micro-LEDs and the n-electrodes.

Figure 16:
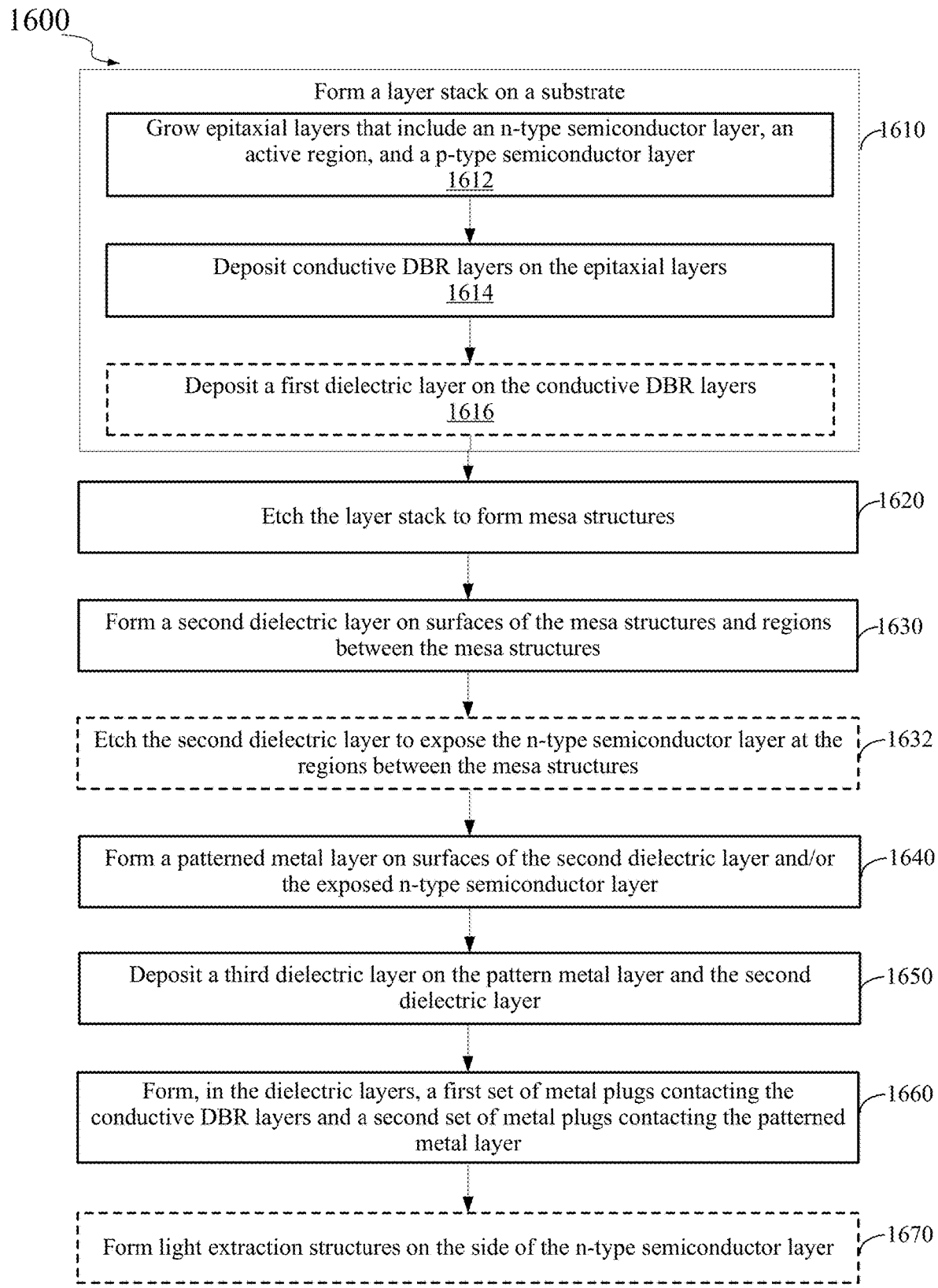
FIG. 16 includes a flowchart illustrating an example of a self-aligned process for fabricating a micro-LED device including a conductive DBR structure acting as both the electrical contact and a back reflector according to certain embodiments.

FIG. 16 includes a flowchart 1600 illustrating an example of a self-aligned process for fabricating a micro-LED device including a conductive DBR structure acting as both the electrical contact (e.g., the p-contact) and a back reflector according to certain embodiments. Flowchart 1600 may be an example of flowchart 1500. It is noted that the operations illustrated in FIG. 16 provide particular processes for fabricating micro-LEDs. Other sequences of operations can also be performed according to alternative embodiments. For example, alternative embodiments may perform the operation in a different order. Moreover, the individual operations illustrated in FIG. 16 can include multiple sub-operations that can be performed in various sequences as appropriate for the individual operation. Furthermore, some operations can be added or removed depending on the particular applications. In some implementations, two or more operations may be performed in parallel. One of ordinary skill in the art would recognize many variations, modifications, and alternatives.

Operations in block 1610 of flowchart 1600 may include forming a layer stack on a substrate (e.g., a silicon or sapphire wafer). The layer stack may include a plurality of epitaxial layers and a plurality of transparent conductive oxide layers that form a conductive DBR. Forming the layer stack may include, at block 1612, growing the plurality of epitaxial layers that includes an n-type semiconductor layer, an active region configured to emit visible light having a first wavelength, and a p-type semiconductor layer. Forming the layer stack may also include, at block 1614, depositing the plurality of transparent conductive oxide layers on the plurality of epitaxial layers. The plurality of transparent conductive oxide layers may include a first set of transparent conductive oxide layers characterized by a first refractive index, and a second set of transparent conductive oxide layers characterized by a second refractive index and interleaved with the first set of transparent conductive oxide layers, where a reflectance of the conductive DBR for the first wavelength is greater than 90%, greater than about 95%, or greater than about 98%. The first set of transparent conductive oxide layers may include a first set of ITO layers. The second set of transparent conductive oxide layers may include a second set of ITO layers. The first set of ITO layers and the second set of ITO layers may have different porosities or different nanorod orientations as described above. Forming the layer stack may also include, at block 1616, depositing a first dielectric (e.g., oxide) layer on the conductive DBR.

Operations at block 1620 may include etching the layer stack to form an array of mesa structures. The array of mesa structures may be characterized by a pitch equal to or less than about 4 µm, less than about 3 µm, or less than about 2 µm. Each mesa structure may be characterized by a linear lateral dimension less than about 3 µm, less than about 2 µm, or less than about 1.5 µm. The layer stack may be etched through the plurality of transparent conductive oxide layers and at least some of the plurality of epitaxial layers. For example, the n-type semiconductor layer may be partially etched. The etching may be performed in a single etch step or in multiple etch steps using the same etch mask. As such, the conductive DBR and the epitaxial layers in each mesa structure may have similar or same lateral dimensions. For example, the conductive DBR may cover at least 80% or at least 90% of the lateral region of the epitaxial layers in each mesa structure.

At block 1630, a second dielectric layer (e.g., $SiO_2$) may be formed on surfaces (e.g., top and sidewall surfaces) of the mesa structures and regions between the mesa structures. The second dielectric layer may function as a passivation and isolation layer at the sidewalls of the mesa structures. The second dielectric layer may have a thickness, for example, about 100 to about 200 nm. The second dielectric layer may be conformally deposited on the top surfaces and the sidewall surfaces of the mesa structures by a deposition process, such as a CVD process or an ALD process.

Optionally, at block 1632, the second dielectric layer at regions between the mesa structures may be etched, for example, using the second dielectric layer on top of the mesa structures as the etch mask, to expose the n-type semiconductor layer at the regions between the mesa structures. In some embodiments, the n-type semiconductor layer may be further etched to form U-shaped, V-shaped, or parabolic shaped voids in the n-type semiconductor layer for making n-contacts and sidewall reflectors in the subsequent processes.

At block 1640, a patterned metal layer may be formed on surfaces of the second dielectric layer. For example, a metal layer may be conformally deposited on the surfaces of the second dielectric layer and the voids formed in the n-type semiconductor layer. The metal layer may include a metal that has a high conductivity and a high reflectivity, such as aluminum. The metal layer may be patterned, for example, to remove the metal layer in certain regions, such as the metal layer on top of the mesa structure for each micro-LED. The metal layer may function as a current spreading layer, n-contacts, and sidewall reflectors for the micro-LEDs.

At block 1650, the operation may include depositing a third dielectric layer on the patterned metal layer and the second dielectric layer. The third dielectric layer may include, for example, a $SiO_2$ layer. The third dielectric layer may be a thick dielectric layer and may fill the gaps between the metal layer in regions between the mesa structures. The thickness of the third dielectric layer on top of the second dielectric layer may be, for example, about 1 µm.

Operations at block 1660 may include forming, in the dielectric layers, a first set of metal plugs (e.g., p-electrodes) contacting the conductive DBR and a second set of metal plugs (e.g., n-electrodes) contacting the patterned metal layer. For example, the dielectric layers on top of each mesa structure may be etched to form an aperture (e.g., a trench), and the aperture may be filled with a metal (e.g., aluminum, titanium, copper, etc.) to form a p-electrode that contacts the conductive DBR. In some embodiments, some areas of the dielectric layers on top of the patterned metal layer may be etched to form apertures, and the apertures may be filled with a metal (e.g., aluminum, titanium, copper, etc.) to form one or more n-electrodes that contact the patterned metal layer.

Optionally, at block 1670, light extraction structures, such as micro-lenses, may be formed on the epitaxial layers (e.g., on the n-type semiconductor layer). In some embodiments, the light extraction structures may be formed after the processed wafer including the micro-LEDs is bonded to a silicon wafer (e.g., a CMOS backplane) with driver and control circuits fabricated thereon, and/or after the substrate (e.g., the silicon or sapphire wafer) is thinned or removed. The CMOS backplane may have bonding pads formed thereon. Bonding pads on the CMOS backplane and the metal plugs on the processed wafer or die may be bonded together. In some embodiments, the gap between the wafer or die including the micro-LEDs and the CMOS backplane may be filled with a non-conductive material, such as a dielectric material or an organic material (e.g., an epoxy or a resin). In some embodiments, the surface of the CMOS backplane and the surface of the wafer or die including the micro-LEDs may each include a dielectric layer and the two dielectric layers may be bonded together in a hybrid bonding process. The substrate of the micro-LEDs (e.g., the silicon or sapphire wafer) may then be thinned or removed from the bonded device. The light extraction structures (e.g., micro-lenses) may be formed on the light emitting side of the bonded device. For example, the light extraction structures may be etched in the epitaxial layers, or may be formed in a dielectric, semiconductor, or organic material layer deposited on the side of the n-type semiconductor layer of the epitaxial layers.

Figures 17A, 17B:
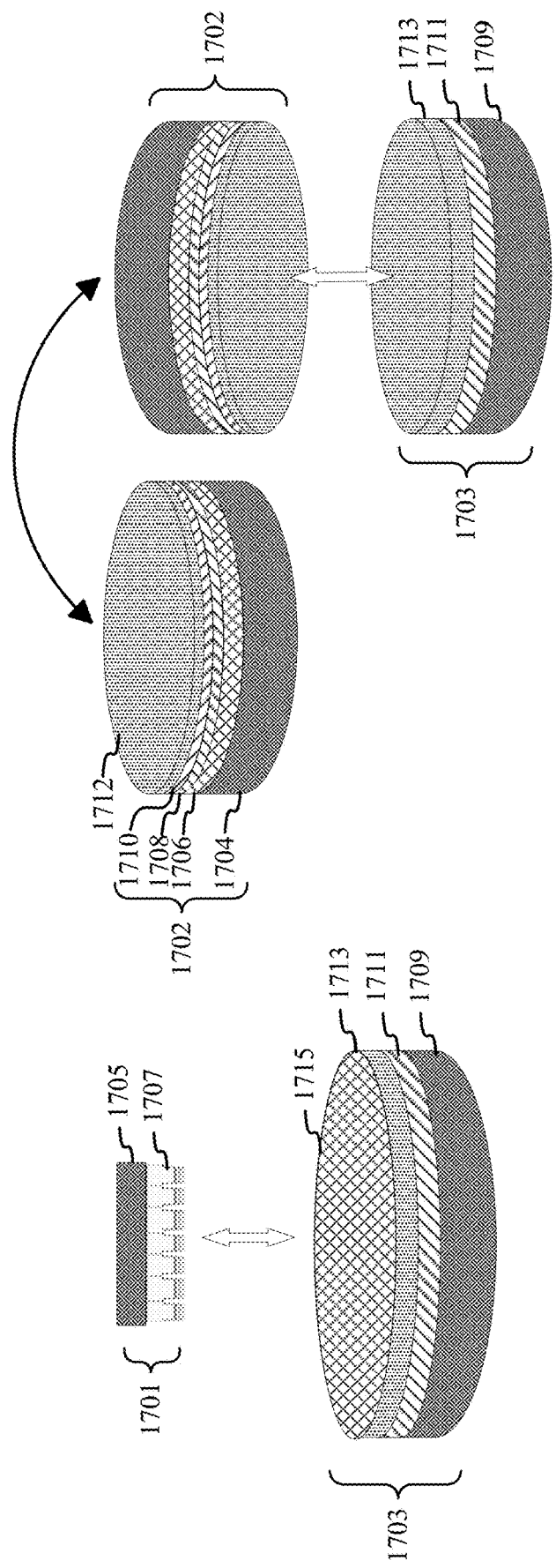
FIG. 17A illustrates an example of a method of die-to-wafer bonding for arrays of LEDs according to certain embodiments.
FIG. 17B illustrates an example of a method of wafer-to-wafer bonding for arrays of LEDs according to certain embodiments.

FIG. 17A illustrates an example of a method of die-to-wafer bonding for arrays of LEDs according to certain embodiments. In the example shown in FIG. 17A, an LED array 1701 may include a plurality of LEDs 1707 on a carrier substrate 1705. Carrier substrate 1705 may include various materials, such as GaAs, InP, GaN, AlN, sapphire, SiC, Si, or the like. LEDs 1707 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1703 may include a base layer 1709 having passive or active integrated circuits (e.g., driver circuits 1711) fabricated thereon. Base layer 1709 may include, for example, a silicon wafer. Driver circuits 1711 may be used to control the operations of LEDs 1707. For example, the driver circuit for each LED 1707 may include a 2T1C pixel structure that has two transistors and one capacitor. Wafer 1703 may also include a bonding layer 1713. Bonding layer 1713 may include various materials, such as a metal, an oxide, a dielectric, CuSn, AuTi, and the like. In some embodiments, a patterned layer 1715 may be formed on a surface of bonding layer 1713, where patterned layer 1715 may include a metallic grid made of a conductive material, such as Cu, Ag, Au, Al, or the like.

LED array 1701 may be bonded to wafer 1703 via bonding layer 1713 or patterned layer 1715. For example, patterned layer 1715 may include metal pads or bumps made of various materials, such as CuSn, AuSn, or nanoporous Au, that may be used to align LEDs 1707 of LED array 1701 with corresponding driver circuits 1711 on wafer 1703. In one example, LED array 1701 may be brought toward wafer 1703 until LEDs 1707 come into contact with respective metal pads or bumps corresponding to driver circuits 1711. Some or all of LEDs 1707 may be aligned with driver circuits 1711, and may then be bonded to wafer 1703 via patterned layer 1715 by various bonding techniques, such as metal-to-metal bonding. After LEDs 1707 have been bonded to wafer 1703, carrier substrate 1705 may be removed from LEDs 1707.

FIG. 17B illustrates an example of a method of wafer-to-wafer bonding for arrays of LEDs according to certain embodiments. As shown in FIG. 17B, a first wafer 1702 may include a substrate 1704, a first semiconductor layer 1706, active layers 1708, and a second semiconductor layer 1710. Substrate 1704 may include various materials, such as GaAs, InP, GaN, AlN, sapphire, SiC, Si, or the like. First semiconductor layer 1706, active layers 1708, and second semiconductor layer 1710 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1706 may be an n-type layer, and second semiconductor layer 1710 may be a p-type layer. For example, first semiconductor layer 1706 may be an n-doped GaN layer (e.g., doped with Si or Ge), and second semiconductor layer 1710 may be a p-doped GaN layer (e.g., doped with Mg, Ca, Zn, or Be). Active layers 1708 may include, for example, one or more GaN layers, one or more InGaN layers, one or more AlInGaP layers, and the like, which may form one or more heterostructures, such as one or more quantum wells or MQWs.

In some embodiments, first wafer 1702 may also include a bonding layer. Bonding layer 1712 may include various materials, such as a metal, an oxide, a dielectric, CuSn, AuTi, or the like. In one example, bonding layer 1712 may include p-contacts and/or n-contacts (not shown). In some embodiments, other layers may also be included on first wafer 1702, such as a buffer layer between substrate 1704 and first semiconductor layer 1706. The buffer layer may include various materials, such as polycrystalline GaN or AlN. In some embodiments, a contact layer may be between second semiconductor layer 1710 and bonding layer 1712. The contact layer may include any suitable material for providing an electrical contact to second semiconductor layer 1710 and/or first semiconductor layer 1706.

First wafer 1702 may be bonded to wafer 1703 that includes driver circuits 1711 and bonding layer 1713 as described above, via bonding layer 1713 and/or bonding layer 1712. Bonding layer 1712 and bonding layer 1713 may be made of the same material or different materials. Bonding layer 1713 and bonding layer 1712 may be substantially flat. First wafer 1702 may be bonded to wafer 1703 by various methods, such as metal-to-metal bonding, eutectic bonding, metal oxide bonding, anodic bonding, thermo-compression bonding, ultraviolet (UV) bonding, and/or fusion bonding.

As shown in FIG. 17B, first wafer 1702 may be bonded to wafer 1703 with the p-side (e.g., second semiconductor layer 1710) of first wafer 1702 facing down (i.e., toward wafer 1703). After bonding, substrate 1704 may be removed from first wafer 1702, and first wafer 1702 may then be processed from the n-side. The processing may include, for example, the formation of certain mesa shapes for individual LEDs, as well as the formation of optical components corresponding to the individual LEDs.

FIGS. 18A-18D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 18A shows a substrate 1810 with passive or active circuits 1820 manufactured thereon. As described above with respect to FIGS. 17A-17B, substrate 1810 may include, for example, a silicon wafer. Circuits 1820 may include driver circuits for the arrays of LEDs. A bonding layer may include dielectric regions 1840 and contact pads 1830 connected to circuits 1820 through electrical interconnects 1822. Contact pads 1830 may include, for example, Cu, Ag, Au, Al, W, Mo, Ni, Ti, Pt, Pd, or the like. Dielectric materials in dielectric regions 1840 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 1805. The activated surface may be atomically clean and may be reactive for formation of direct bonds between wafers when they are brought into contact, for example, at room temperature.

FIG. 18B illustrates a wafer 1850 including an array of micro-LEDs 1870 fabricated thereon as described above. Wafer 1850 may be a carrier wafer and may include, for example, GaAs, InP, GaN, AlN, sapphire, SiC, Si, or the like. Micro-LEDs 1870 may include an n-type layer, an active region, and a p-type layer epitaxially grown on wafer 1850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 1880 and n-contacts 1882 may be formed in a dielectric material layer 1860 deposited on the mesa structures and may make electrical contacts with the p-type layer and the n-type layers, respectively. Dielectric materials in dielectric material layer 1860 may include, for example, SiCN, $SiO_2$, SiN, $Al_2O_3$, $HfO_2$, $ZrO_2$, $Ta_2O_5$, or the like. P-contacts 1880 and n-contacts 1882 may include, for example, Cu, Ag, Au, Al, W, Mo, Ni, Ti, Pt, Pd, or the like. The top surfaces of p-contacts 1880, n-contacts 1882, and dielectric material layer 1860 may form a bonding layer. The bonding layer may be planarized and polished using, for example, chemical mechanical polishing, where the polishing may cause dishing in p-contacts 1880 and n-contacts 1882. The bonding layer may then be cleaned and activated by, for example, an ion (e.g., plasma) or fast atom (e.g., Ar) beam 1815. The activated surface may be atomically clean and reactive for formation of direct bonds between wafers when they are brought into contact, for example, at room temperature.

FIG. 18C illustrates a room temperature bonding process for bonding the dielectric materials in the bonding layers. For example, after the bonding layer that includes dielectric regions 1840 and contact pads 1830 and the bonding layer that includes p-contacts 1880, n-contacts 1882, and dielectric material layer 1860 are surface activated, wafer 1850 and micro-LEDs 1870 may be turned upside down and brought into contact with substrate 1810 and the circuits formed thereon. In some embodiments, compression pressure 1825 may be applied to substrate 1810 and wafer 1850 such that the bonding layers are pressed against each other. Due to the surface activation and the dishing in the contacts, dielectric regions 1840 and dielectric material layer 1860 may be in direct contact because of the surface attractive force, and may react and form chemical bonds between them because the surface atoms may have dangling bonds and may be in unstable energy states after the activation. Thus, the dielectric materials in dielectric regions 1840 and dielectric material layer 1860 may be bonded together with or without heat treatment or pressure.

FIG. 18D illustrates an annealing process for bonding the contacts in the bonding layers after bonding the dielectric materials in the bonding layers. For example, contact pads 1830 and p-contacts 1880 or n-contacts 1882 may be bonded together by annealing at, for example, about 180-400° C. or higher. During the annealing process, heat 1835 may cause the contacts to expand more than the dielectric materials (due to different coefficients of thermal expansion), and thus may close the dishing gaps between the contacts such that contact pads 1830 and p-contacts 1880 or n-contacts 1882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 19:
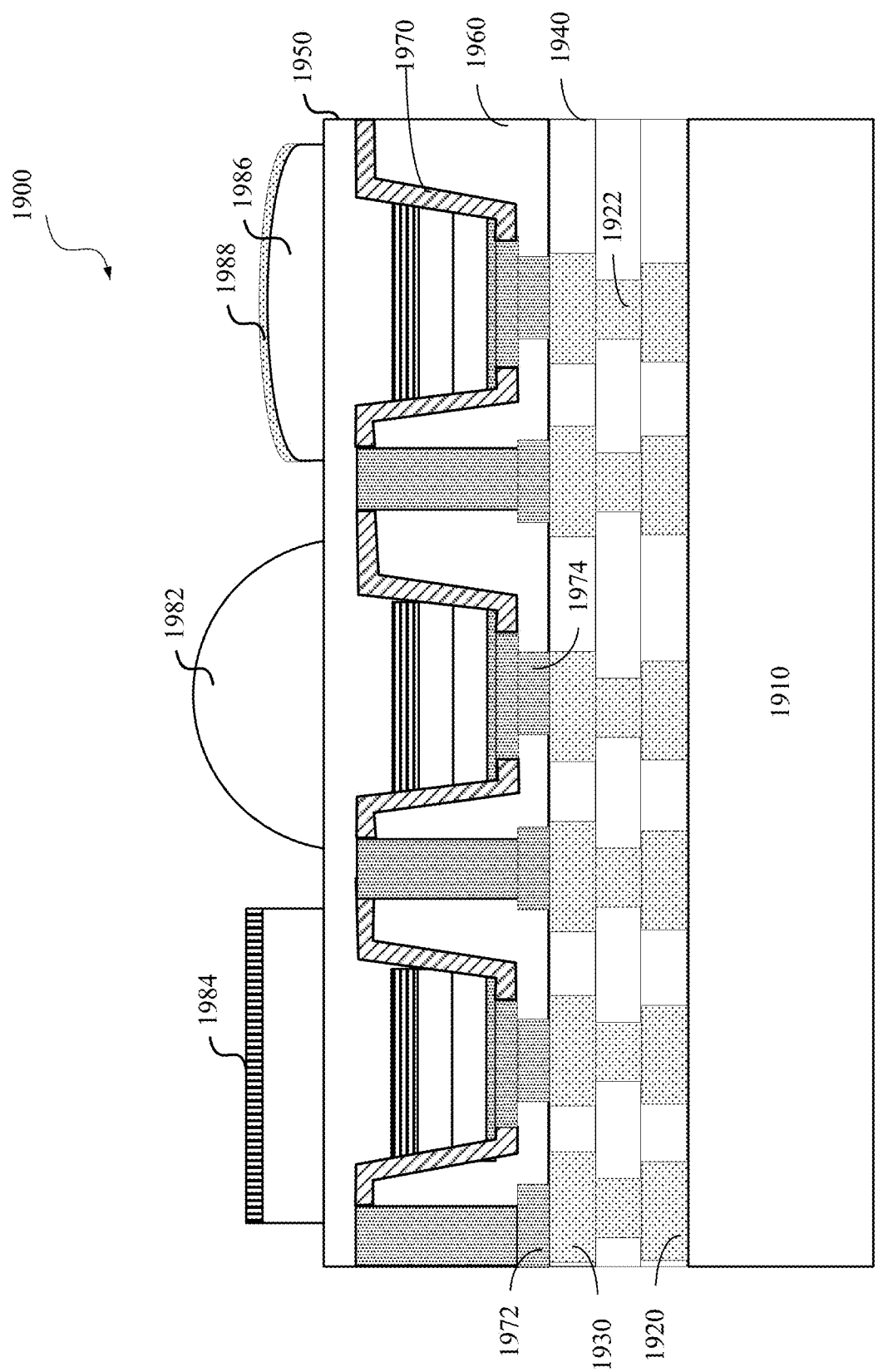
FIG. 19 illustrates an example of an LED array with secondary optical components fabricated thereon according to certain embodiments.

FIG. 19 illustrates an example of an LED array 1900 with secondary optical components fabricated thereon according to certain embodiments. LED array 1900 may be made by bonding an LED chip or wafer with a silicon wafer including electrical circuits fabricated thereon, using any suitable bonding techniques described above with respect to, for example, FIGS. 17A-18D. In the example shown in FIG. 19, LED array 1900 may be bonded using a wafer-to-wafer hybrid bonding technique as described above with respect to FIG. 18A-18D. LED array 1900 may include a substrate 1910, which may be, for example, a silicon wafer. Integrated circuits 1920, such as LED driver circuits, may be fabricated on substrate 1910. Integrated circuits 1920 may be connected to p-contacts 1974 and n-contacts 1972 of micro-LEDs 1970 through interconnects 1922 and contact pads 1930, where contact pads 1930 may form metallic bonds with p-contacts 1974 and n-contacts 1972. Dielectric layer 1940 on substrate 1910 may be bonded to dielectric layer 1960 through fusion bonding.

The substrate (not shown) of the LED chip or wafer may be thinned or may be removed to expose the n-type layer 1950 of micro-LEDs 1970. Various secondary optical components, such as a spherical micro-lens 1982, a grating 1984, a micro-lens 1986, an antireflection layer 1988, and the like, may be formed in or on top of n-type layer 1950. For example, spherical micro-lens arrays may be etched in the semiconductor materials of micro-LEDs 1970 using a gray-scale mask and a photoresist with a linear response to exposure light, or using an etch mask formed by thermal reflowing of a patterned photoresist layer. The secondary optical components may also be etched in a dielectric layer deposited on n-type layer 1950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, $SiCN$, $SiO_2$, $SiN$, $Al_2O_3$, $HfO_2$, $ZrO_2$, $Ta_2O_5$, or the like. In some embodiments, a micro-LED 1970 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 19 to show some examples of secondary optical components that can be formed on micro-LEDs 1970, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 20:
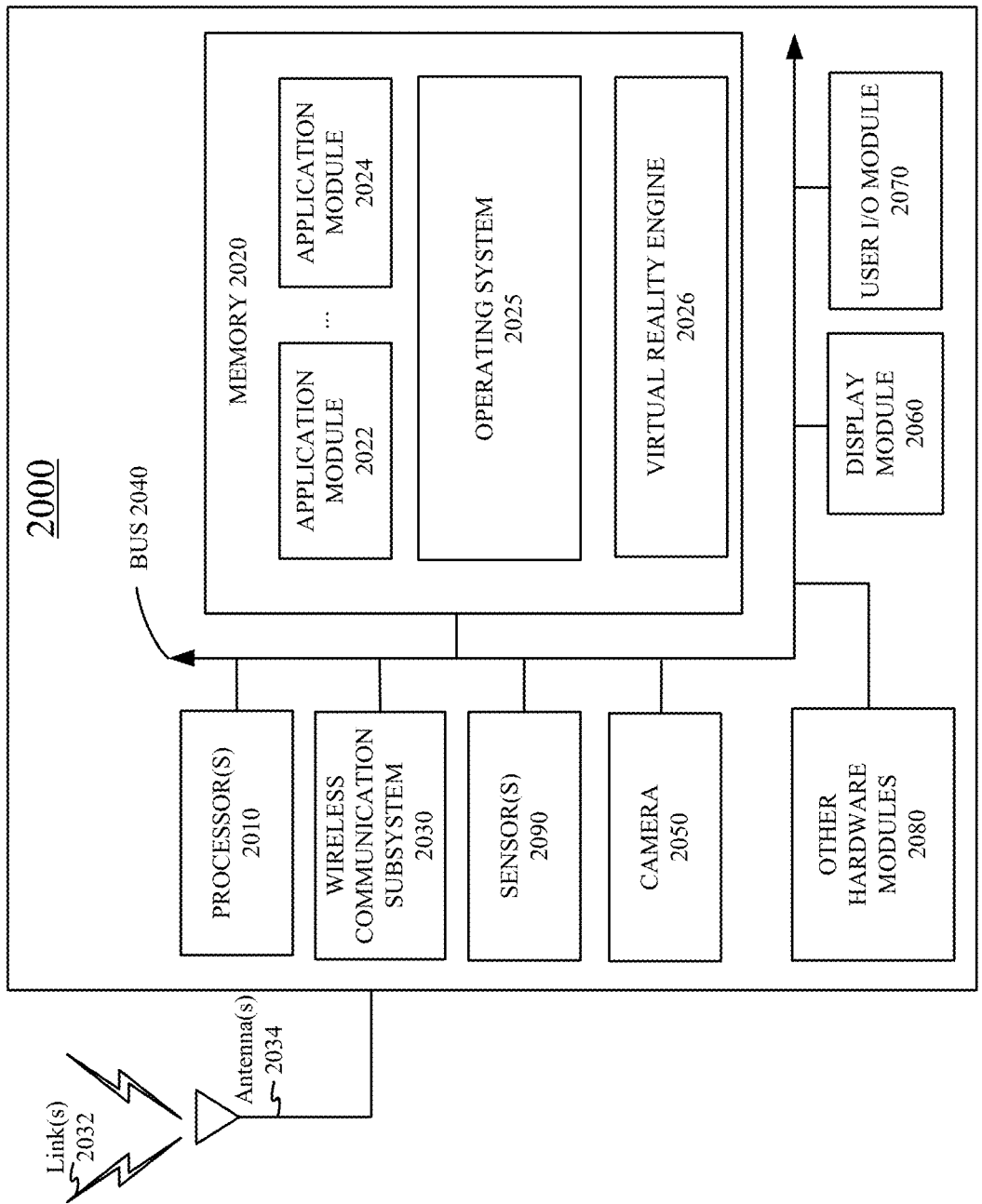
FIG. 20 is a simplified block diagram of an electronic system of an example of a near-eye display according to certain embodiments.

FIG. 20 is a simplified block diagram of an example electronic system 2000 of an example near-eye display (e.g., HMD device) for implementing some of the examples disclosed herein. Electronic system 2000 may be used as the electronic system of an HMD device or other near-eye displays described above. In this example, electronic system 2000 may include one or more processor(s) 2010 and a memory 2020. Processor(s) 2010 may be configured to execute instructions for performing operations at a number of components, and can be, for example, a general-purpose processor or microprocessor suitable for implementation within a portable electronic device. Processor(s) 2010 may be communicatively coupled with a plurality of components within electronic system 2000. To realize this communicative coupling, processor(s) 2010 may communicate with the other illustrated components across a bus 2040. Bus 2040 may be any subsystem adapted to transfer data within electronic system 2000. Bus 2040 may include a plurality of computer buses and additional circuitry to transfer data.

Memory 2020 may be coupled to processor(s) 2010. In some embodiments, memory 2020 may offer both short-term and long-term storage and may be divided into several units.

Memory 2020 may be volatile, such as static random access memory (SRAM) and/or dynamic random access memory (DRAM) and/or non-volatile, such as read-only memory (ROM), flash memory, and the like. Furthermore, memory 2020 may include removable storage devices, such as secure digital (SD) cards. Memory 2020 may provide storage of computer-readable instructions, data structures, program modules, and other data for electronic system 2000. In some embodiments, memory 2020 may be distributed into different hardware modules. A set of instructions and/or code might be stored on memory 2020. The instructions might take the form of executable code that may be executable by electronic system 2000, and/or might take the form of source and/or installable code, which, upon compilation and/or installation on electronic system 2000 (e.g., using any of a variety of generally available compilers, installation programs, compression/decompression utilities, etc.), may take the form of executable code.

In some embodiments, memory 2020 may store a plurality of application modules 2022 through 2024, which may include any number of applications. Examples of applications may include gaming applications, conferencing applications, video playback applications, or other suitable applications. The applications may include a depth sensing function or eye tracking function. Application modules 2022-2024 may include particular instructions to be executed by processor(s) 2010. In some embodiments, certain applications or parts of application modules 2022-2024 may be executable by other hardware modules 2080. In certain embodiments, memory 2020 may additionally include secure memory, which may include additional security controls to prevent copying or other unauthorized access to secure information.

In some embodiments, memory 2020 may include an operating system 2025 loaded therein. Operating system 2025 may be operable to initiate the execution of the instructions provided by application modules 2022-2024 and/or manage other hardware modules 2080 as well as interfaces with a wireless communication subsystem 2030 which may include one or more wireless transceivers. Operating system 2025 may be adapted to perform other operations across the components of electronic system 2000 including threading, resource management, data storage control and other similar functionality.

Wireless communication subsystem 2030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2000 may include one or more antennas 2034 for wireless communication as part of wireless communication subsystem 2030 or as a separate component coupled to any portion of the system. Depending on desired functionality, wireless communication subsystem 2030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2030 may permit data to be exchanged with a network, other computer systems, and/or any other devices described herein. Wireless communication subsystem 2030 may include a means for transmitting or receiving data, such as identifiers of HMD devices, position data, a geographic map, a heat map, photos, or videos, using antenna(s) 2034 and wireless link(s) 2032. Wireless communication subsystem 2030, processor(s) 2010, and memory 2020 may together comprise at least a part of one or more of a means for performing some functions disclosed herein.

Embodiments of electronic system 2000 may also include one or more sensors 2090. Sensor(s) 2090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2000 may include a display module 2060. Display module 2060 may be a near-eye display, and may graphically present information, such as images, videos, and various instructions, from electronic system 2000 to a user. Such information may be derived from one or more application modules 2022-2024, virtual reality engine 2026, one or more other hardware modules 2080, a combination thereof, or any other suitable means for resolving graphical content for the user (e.g., by operating system 2025). Display module 2060 may use LCD technology, LED technology (including, for example, OLED, ILED, µ-LED, AMO-LED, TOLED, etc.), light emitting polymer display (LPD) technology, or some other display technology.

Electronic system 2000 may include a user input/output module 2070. User input/output module 2070 may allow a user to send action requests to electronic system 2000. An action request may be a request to perform a particular action. For example, an action request may be to start or end an application or to perform a particular action within the application. User input/output module 2070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2000. In some embodiments, user input/output module 2070 may provide haptic feedback to the user in accordance with instructions received from electronic system 2000. For example, the haptic feedback may be provided when an action request is received or has been performed.

Electronic system 2000 may include a camera 2050 that may be used to take photos or videos of a user, for example, for tracking the user's eye position. Camera 2050 may also be used to take photos or videos of the environment, for example, for VR, AR, or MR applications. Camera 2050 may include, for example, a complementary metal-oxide-semiconductor (CMOS) image sensor with a few millions or tens of millions of pixels. In some implementations, camera 2050 may include two or more cameras that may be used to capture 3-D images.

In some embodiments, electronic system 2000 may include a plurality of other hardware modules 2080. Each of other hardware modules 2080 may be a physical module within electronic system 2000. While each of other hardware modules 2080 may be permanently configured as a structure, some of other hardware modules 2080 may be temporarily configured to perform specific functions or temporarily activated. Examples of other hardware modules 2080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2080 may be implemented in software.

In some embodiments, memory 2020 of electronic system 2000 may also store a virtual reality engine 2026. Virtual reality engine 2026 may execute applications within electronic system 2000 and receive position information, acceleration information, velocity information, predicted future positions, or any combination thereof of the HMD device from the various sensors. In some embodiments, the information received by virtual reality engine 2026 may be used for producing a signal (e.g., display instructions) to display module 2060. For example, if the received information indicates that the user has looked to the left, virtual reality engine 2026 may generate content for the HMD device that mirrors the user's movement in a virtual environment. Additionally, virtual reality engine 2026 may perform an action within an application in response to an action request received from user input/output module 2070 and provide feedback to the user. The provided feedback may be visual, audible, or haptic feedback. In some implementations, processor(s) 2010 may include one or more GPUs that may execute virtual reality engine 2026.

In various implementations, the above-described hardware and modules may be implemented on a single device or on multiple devices that can communicate with one another using wired or wireless connections. For example, in some implementations, some components or modules, such as GPUs, virtual reality engine 2026, and applications (e.g., tracking application), may be implemented on a console separate from the head-mounted display device. In some implementations, one console may be connected to or support more than one HMD.

In alternative configurations, different and/or additional components may be included in electronic system 2000. Similarly, functionality of one or more of the components can be distributed among the components in a manner different from the manner described above. For example, in some embodiments, electronic system 2000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method comprising:
   forming a layer stack on a substrate, the layer stack including:
   a plurality of epitaxial layers; and
   a plurality of transparent conductive oxide layers that form a conductive distributed Bragg reflector (DBR);
   etching the layer stack using a same etch mask layer to form an array of mesa structures in the layer stack, the array of mesa structures characterized by a pitch equal to or less than 4 μm;
   forming a first dielectric layer on surfaces of the array of mesa structures and regions between mesa structures in the array of mesa structures;
   forming a patterned metal layer on surfaces of the first dielectric layer;
   depositing a second dielectric layer on the patterned metal layer and the first dielectric layer; and
   forming, in the first dielectric layer and the second dielectric layer, at least one of a first set of metal plugs contacting the conductive DBR, or a second set of metal plugs contacting the patterned metal layer.

2. The method of claim 1, wherein forming the layer stack on the substrate comprises:
   growing the plurality of epitaxial layers on the substrate, the plurality of epitaxial layers comprising an n-type semiconductor layer, an active region configured to emit visible light having a first wavelength, and a p-type semiconductor layer; and
   depositing the plurality of transparent conductive oxide layers on the plurality of epitaxial layers, the plurality of transparent conductive oxide layers comprising:
   a first set of transparent conductive oxide layers characterized by a first refractive index; and
   a second set of transparent conductive oxide layers characterized by a second refractive index and interleaved with the first set of transparent conductive oxide layers,
   wherein a reflectance of the conductive DBR for the first wavelength is greater than 90%.

3. The method of claim 2, wherein:
   the first set of transparent conductive oxide layers includes a first set of indium tin oxide (ITO) layers;
   the second set of transparent conductive oxide layers includes a second set of ITO layers; and
   the first set of ITO layers and the second set of ITO layers have different porosities or different nanorod orientations.

4. The method of claim 2, further comprising etching, at the regions between the mesa structures, the first dielectric layer and at least a portion of the n-type semiconductor layer, wherein forming the patterned metal layer on the surfaces of the first dielectric layer comprises forming the patterned metal layer on exposed surfaces of the n-type semiconductor layer.

5. The method of claim 2, further comprising forming a transparent conductive layer on the plurality of epitaxial layers, the transparent conductive layer electrically coupled to at least one of the second set of metal plugs, the patterned metal layer, or the n-type semiconductor layer.

6. The method of claim 1, further comprising forming an array of light extraction structures on the plurality of epitaxial layers, each of the array of light extraction structures corresponding to a respective mesa structure of the array of mesa structures.

* * * * *